(12) United States Patent
Lee et al.

(10) Patent No.: US 9,753,194 B2
(45) Date of Patent: Sep. 5, 2017

(54) DISPLAY DEVICE

(71) Applicant: Samsung Display Co., Ltd., Yongin, Gyeonggi-Do (KR)

(72) Inventors: Minsu Lee, Seoul (KR); Chul Huh, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 109 days.

(21) Appl. No.: 14/596,452

(22) Filed: Jan. 14, 2015

(65) Prior Publication Data

US 2015/0293280 A1 Oct. 15, 2015

(30) Foreign Application Priority Data

Apr. 9, 2014 (KR) .................. 10-2014-0042449

(51) Int. Cl.
*G02B 5/22* (2006.01)
*G02B 5/20* (2006.01)
(Continued)

(52) U.S. Cl.
CPC .............. *G02B 5/201* (2013.01); *G02B 5/008* (2013.01); *G02B 5/223* (2013.01);
(Continued)

(58) Field of Classification Search
CPC ............... H01L 27/322; H01L 27/3211; H01L 51/5016; H01L 51/5036; C09K 11/06;
(Continued)

(56) References Cited

U.S. PATENT DOCUMENTS 6,040,936 A * 3/2000 Kim ................. G02B 5/008
                                                  359/245
6,197,458 B1* 3/2001 Kato ................. G02B 5/223
                                                  347/106
(Continued)

FOREIGN PATENT DOCUMENTS

| JP | 5006459 B1 | 8/2012 |
| KR | 10-2011-0078570 A | 7/2011 |
| KR | 10-1092639 B1 | 12/2011 |

OTHER PUBLICATIONS

Chu et al., "Advances and Issues in White OLED and Color Filter Architecture", SID 07 Digest, 2007, p. 1118—4 pages.

*Primary Examiner* — Scott J Sugarman
*Assistant Examiner* — Balram Parbadia
(74) *Attorney, Agent, or Firm* — Knobbe Martens Olson & Bear LLP

(57) ABSTRACT

A display device includes a first substrate, and a second substrate opposing the first substrate and including a color filter layer. The color filter layer includes a red color filter, a green color filter and a blue color filter. The red color filter includes a first fluorescent dye and a first nanoparticle, and illustrates red color. The green color filter includes a second fluorescent dye and a second nanoparticle and illustrates green color. The blue color filter includes a third fluorescent dye and a third nanoparticle and illustrates blue color. Each of the first to third nanoparticles has a non-spherical shape and has maximum extinction at the first wavelength, the second wavelength and the third wavelength. The first wavelength is greater than the second wavelength, and the second wavelength is greater than the third wavelength.

16 Claims, 21 Drawing Sheets

(51) Int. Cl.
  *G02F 1/1335* (2006.01)
  *G02B 5/00* (2006.01)
  *G03F 7/00* (2006.01)
  *G03F 7/105* (2006.01)
  *G03F 7/20* (2006.01)
  *H01L 27/32* (2006.01)

(52) U.S. Cl.
  CPC ...... *G02F 1/133514* (2013.01); *G03F 7/0007* (2013.01); *G03F 7/105* (2013.01); *G03F 7/2053* (2013.01); *G02F 2202/36* (2013.01); *H01L 27/322* (2013.01)

(58) Field of Classification Search
  CPC .. C09K 19/00; G02B 5/008; G02B 2207/113; G02B 5/223; G02B 5/22; G02F 1/133514; G02F 1/133603; G02F 1/133617; G02F 2203/10; G02F 2203/34; C09D 11/50; C09D 5/29; G03F 7/0007; H01J 2211/444
  See application file for complete search history.

(56) References Cited

U.S. PATENT DOCUMENTS

| | | | |
|---|---|---|---|
| 6,999,222 B2 | 2/2006 | Bazan et al. | |
| 7,492,458 B2 | 2/2009 | Malak | |
| 7,952,272 B2 | 5/2011 | Oumi et al. | |
| 8,581,230 B2 | 11/2013 | Kim et al. | |
| 2003/0127968 A1* | 7/2003 | Kuma | H01L 27/322 313/503 |
| 2003/0214697 A1* | 11/2003 | Duthaler | G02F 1/167 359/296 |
| 2005/0128272 A1* | 6/2005 | Morohoshi | B41M 5/0023 347/100 |
| 2009/0122239 A1* | 5/2009 | Park | C09B 33/04 349/106 |
| 2011/0039078 A1* | 2/2011 | Brennan Fournet | B22F 1/0022 428/195.1 |
| 2012/0064134 A1 | 3/2012 | Bourke, Jr. et al. | |
| 2012/0313129 A1 | 12/2012 | Zettsu et al. | |
| 2012/0326180 A1* | 12/2012 | Ohe | H01L 27/322 257/88 |

\* cited by examiner

DISPLAY DEVICE

CROSS-REFERENCE TO RELATED APPLICATIONS

This U.S. non-provisional patent application claims priority under 35 U.S.C. §119 of Korean Patent Application No. 10-2014-0042449, filed on Apr. 9, 2014, the entire contents of which are hereby incorporated by reference.

BACKGROUND

The present disclosure herein relates to a display device, and more particularly, to a display device having high luminance.

Recently, various display devices for processing and displaying a large amount of information are being developed. Accordingly, various display devices having good properties such as slim, light weight, low-power consumption, etc. have been introduced and have replaced a commonly used cathode ray tube (CRT). For example, liquid crystal display devices (LCDs), plasma display panel devices (PDPs), field emission display devices (FEDs), organic electroluminescence devices (OED), organic electroluminescence devices (OLEDs) and electrophoretic display device (EPDs), etc., are introduced.

The display devices include color filters for displaying color images. Light having a certain wavelength among light from a light source pass a color filter to exhibit color. In this case, the amount of light not passing through the color filter is large, and this may deteriorate the luminance of displayed images. Thus, researches to increase the luminance thereof are being actively conducted.

SUMMARY

The present disclosure provides a display device having high luminance.

One aspect of the invention provides a display device, comprising: a first substrate, and a second substrate facing the first substrate and including a color filter layer. The color filter layer includes a red color filter, a green color filter and a blue color filter. The red color filter includes a first fluorescent dye being provided with first light and emitting second light having a different wavelength from the first light, and a first nanoparticle being provided with the first light and generating surface Plasmon resonance. The red color filter illustrates red color. The green color filter includes a second fluorescent dye being provided with the first light and emitting third light having a different wavelength from the first light and the second light, and a second nanoparticle being provided with the first light and generating surface Plasmon resonance. The green color filter illustrates green color. The blue color filter includes a third fluorescent dye being provided with the first light and emitting fourth light having a different wavelength from the first light to the third light, and a third nanoparticle being provided with the first light and generating surface Plasmon resonance. The blue color filter illustrates blue color. Each of the first to third nanoparticles having a non-spherical shape, the first nanoparticle having maximum extinction at a first wavelength, the second nanoparticle having maximum extinction at a second wavelength smaller than the first wavelength, the third nanoparticle having maximum extinction at a third wavelength smaller than the second wavelength.

In the foregoing device, the first nanoparticle may have a cross-sectional shape different from that of either the second nanoparticle or the third nanoparticle, wherein the second nanoparticle may have a cross-sectional shape different from that of the third nanoparticle. The cross-sectional shapes of the first to third nanoparticles may have the same number of sides. The cross-sectional shapes of the first to third nanoparticles may be hexagonal. The cross-sectional shape of the first nanoparticle may have a first hexagon, the cross-sectional shape of the second nanoparticle may have a second hexagon, the cross-sectional shape of the third nanoparticle may have a third hexagon, the third hexagon is closer to a regular hexagon than the second hexagon, and the second hexagon is closer to a regular hexagon than the first hexagon. The first hexagon may comprise a first side and a second side connected to each other, the second hexagon comprises a first side and a second side connected to each other, the third hexagon comprises a first side and a side connected to each other, and $|A-1|>|B-1|>|C-1|$ may be satisfied when ratio of a length of the first side of the first hexagon to a length of the second side of the first hexagon is A, ratio of a length of the first side of the second hexagon to a length of the second side of the second hexagon is B, and ratio of a length of the first side of the third hexagon to a length of the second side of the third hexagon is C.

Still in the foregoing device, each of the first to third nanoparticles may have a hexagonal prism shape. The heights of the first to third nanoparticles may be substantially the same. The first, second and third nanoparticles may have rod shapes having different lengths, wherein the first nanoparticle is shorter than the second nanoparticle which is shorter than the third nanoparticle. The cross-sectional shapes of the first, second and third nanoparticles may be substantially same. The cross-sectional shapes of the first, second and third nanoparticles may have a circular shape or an elliptical shape. Each of the first to third nanoparticles may have a cavity or a hole. The first to third nanoparticles may be formed of the same material. Each of the first to third nanoparticles may be formed of at least one metal selected from the group consisting of Au, Ag, Al, Co, Cu, Cr, Pt, Ni, Fe, Mo and W, or an oxide of a selected metal.

Yet in the foregoing device, the first wavelength may be from about 600 nm to about 750 nm, the second wavelength may be from about 500 nm to about 550 nm, and the third wavelength may be from about 430 nm to about 480 nm. Each of the first to third nanoparticles may be combined with a leveling agent to form a spherical shape. The first fluorescent dye may be configured to absorb light from the light emission layer and emit red color light, wherein the second fluorescent dye is configured to absorb light from the light emission layer and emit green color light, wherein the third fluorescent dye may be configured to absorb light from the light emission layer and emit blue color light.

Another aspect of the invention provides a display device, comprising: a first substrate; a second substrate facing the first substrate and comprising a color filter layer; and a light emission layer configured to emit light toward the second substrate, the color filter layer comprising: a red color filter comprising a first fluorescent dye configured to absorb light from the light emission layer and emit red color light, and a first nanoparticle, the red color filter illustrating red color; a green color filter comprising a second fluorescent dye configured to absorb light from the light emission layer and emit green color light, and a second nanoparticle, the green color filter illustrating green color; and a blue color filter comprising a third fluorescent dye configured to absorb light from the light emission layer and emit blue color light, and a third nanoparticle, the blue color filter illustrating blue color, each of the first to third nanoparticles having a non-spherical shape, the first nanoparticle having maximum extinction at a first wavelength, the second nanoparticle having maximum extinction at a second wavelength smaller than the first wavelength, the third nanoparticle having maximum extinction at a third wavelength smaller than the second wavelength.

Embodiments of the inventive concept provide display devices including a first substrate, and a second substrate facing the first substrate and including a color filter layer. The color filter layer includes a red color filter, a green color filter and a blue color filter. The red color filter includes a first fluorescent dye being provided with first light and emitting second light having a different wavelength from the first light, and first nanoparticle being provided with the first light and generating surface Plasmon resonance. The red color filter illustrates red color. The green color filter includes a second fluorescent dye being provided with the first light and emitting third light having a different wavelength from the first light and the second light, and second nanoparticle being provided with the first light and generating surface Plasmon resonance. The green color filter illustrates green color. The blue color filter includes a third fluorescent dye being provided with the first light and emitting fourth light having a different wavelength from the first light to the third light, and third nanoparticle being provided with the first light and generating surface Plasmon resonance. The blue color filter illustrates blue color.

Each of the first to third nanoparticles has a non-spherical shape, the first nanoparticle has maximum extinction at a first wavelength, at a second wavelength and at a third wavelength. The first wavelength is greater than the second wavelength, and the second wavelength is greater than the third wavelength.

In some embodiments, the shapes of the cross-sections of the first to third nanoparticles may be different from each other.

In other embodiments, the shapes of the cross-sections of the first to third nanoparticles may have the same number of sides.

In still other embodiments, the cross-sections of the first to third nanoparticles may have hexagonal shapes.

In even other embodiments, the cross-section of the first nanoparticle may have a first hexagon, the cross-section of the second nanoparticle may have a second hexagon, the cross-section of the third nanoparticle may have a third hexagon, the third hexagon may be closer to a regular hexagon than the second hexagon, and the second hexagon may be closer to a regular hexagon than the first hexagon.

In yet other embodiments, the first hexagon may include a first side and a second side connected to each other, the second hexagon may include a first side and a second side connected to each other, and the third hexagon may include a first side and a second side connected to each other. |A−1|>|B−1|>|C−1| may be satisfied when a length of the first side/a length of the second side of the first nanoparticle is A, a length of the first side/a length of the second side of the second nanoparticle is B, and a length of the first side/a length of the second side of the third nanoparticle is C.

In further embodiments, each of the first to third nanoparticles may have a hexagonal pillar shape.

In still further embodiments, the heights of the first to third nanoparticles may be the same.

In even further embodiments, the first nanoparticle may include a numbers of non-spherical unit nanoparticles, the second nanoparticle may include b numbers of the unit nanoparticle, and the third nanoparticle may include c numbers of the unit nanoparticle. Here, a, b and c may be natural numbers satisfying a>b>c.

In yet further embodiments, each of the first to third nanoparticles may be formed by extending the unit nanoparticles in one direction.

In much further embodiments, the cross-section of each of the unit nanoparticle blocks may have a curvature.

In still much further embodiments, the cross-section of each of the unit nanoparticle blocks may have a circular shape or an elliptical shape.

In even much further embodiments, empty space may be formed in each of the first to third nanoparticles.

In yet much further embodiments, the first to third nanoparticles may be formed by using the same material.

In even still further embodiments, each of the first to third nanoparticles may be formed by using at least one metal selected from the group consisting of Au, Ag, Al, Co, Cu, Cr, Pt, Ni, Fe, Mo and W, or an oxide of a selected metal.

In yet still further embodiments, the first wavelength may be from about 600 nm to about 750 nm, the second wavelength may be from about 500 nm to about 550 nm, and the third wavelength may be from about 430 nm to about 480 nm.

In much even further embodiments, each of the first to third nanoparticles may combine with a leveling agent to form a spherical shape.

In still even further embodiments, the leveling agent may include at least one selected from the group consisting of hexane, heptane, octane, nonane, decane, undecane, dodecane, tridecane, tetradecane, pentadecane, hexadecane, cetane, heptadecane, octadecane, nonadecane and icosane.

In the display device according to an embodiment of the inventive concept, the luminance may be increased.

BRIEF DESCRIPTION OF THE DRAWINGS

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings.

DETAILED DESCRIPTION OF EMBODIMENTS

Figure 1:
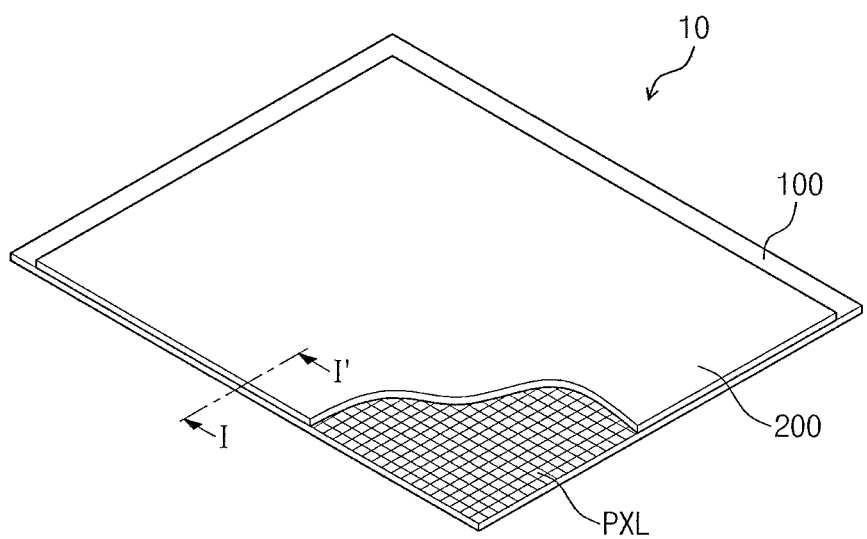
FIG. 1 is a schematic perspective view of a display device according to an embodiment of the inventive concept.

The aspects, features and advantages of the inventive concept will be described below in more detail with reference to embodiments and the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the drawings, like reference numerals refer to like elements throughout the specification, and the dimensions of layers and regions are exaggerated for clarity of illustration. It will be understood that, although the terms first, second, etc. may be used herein to describe various elements, these elements should not be limited by these terms. These terms are only used to distinguish one element from another element. Thus, a first element discussed below could be termed a second element. Similarly, a second element could be termed a first element. As used herein, the singular forms are intended to include the plural forms as well, unless the context clearly indicates otherwise.

It will be further understood that the terms "comprises" and/or "comprising," when used in this specification, specify the presence of stated features, numerals, steps, operations, elements, parts or a combination thereof, but do not preclude the presence or addition of one or more other features, numerals, steps, operations, elements, parts or a combination thereof. It will also be understood that when a layer, film, region, plate, etc. is referred to as being 'on' another layer, film, region, substrate, etc., it can be directly on the other, or an intervening part may also be present. Further, it will be understood that when a layer, film, region, substrate, etc. is referred to as being 'under' another layer, film, region, substrate, etc., it can be directly under, and one or more intervening parts may also be present.

Hereinafter, a display device according to embodiments of the inventive concept will be explained.

A display device according to an embodiment of the inventive concept may be at least one among a liquid crystal display device, an organic light emitting display device, an electrophoretic display device and an electrowetting display device. In an embodiment of the inventive concept, the organic light emitting display device will be explained as an illustration.

FIG. 1 is a schematic perspective view of a display device according to an embodiment of the inventive concept.

Figure 2:
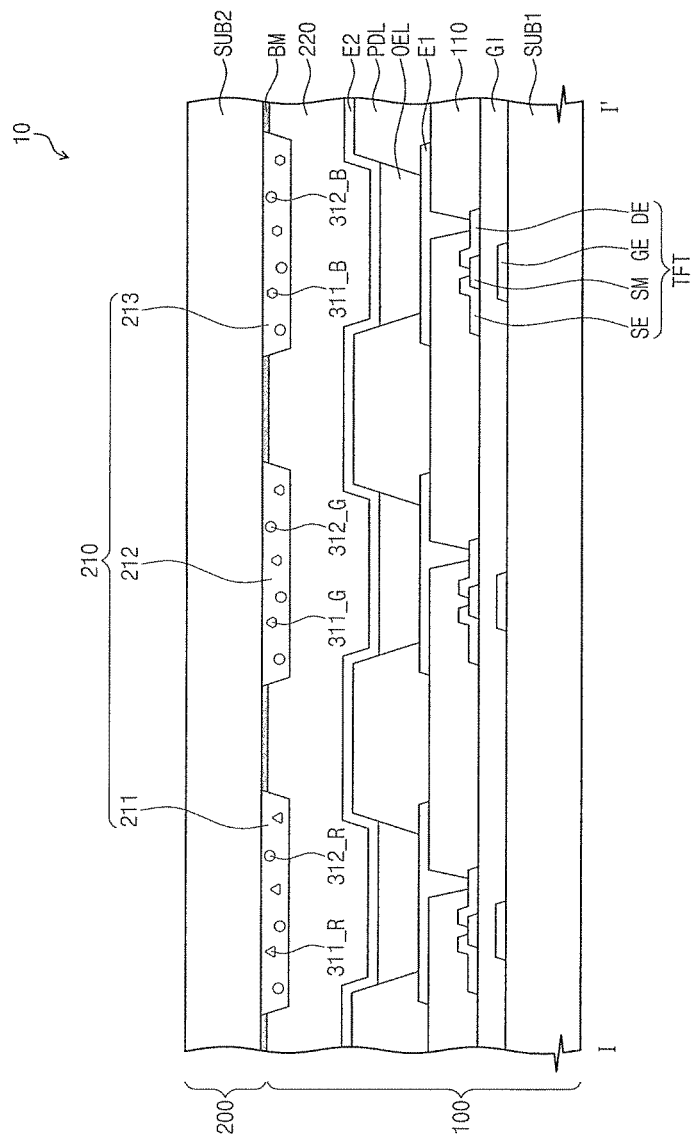
FIG. 2 is a schematic cross-sectional view taken along line I-I' in FIG. 1.

FIG. 2 is a schematic cross-sectional view taken along line I-I' in FIG. 1.

Referring to FIGS. 1 and 2, a display device 10 includes a first substrate 100 and a second substrate 200.

The first substrate 100 may include a first base substrate SUB1, a thin film transistor TFT, a first electrode E1, an organic light emission layer OEL, a pixel defining layer PDL, a second electrode E2 and an encapsulating layer 220.

The display device 10 may include a plurality of pixel areas PXL and a non-displaying area surrounding the pixel areas PXL. The pixel area PXL may display images, and the non-displaying area may not display images. In the pixel area PXL, pixels are provided.

The first base substrate SUB1 may be a commonly used one including a plastic substrate, a glass substrate, and a quartz substrate, without specific limitation. The first base substrate SUB1 may be a transparent insulating substrate.

The thin film transistor TFT is formed on the first base substrate SUB1. The thin film transistor TFT applies an electric field to corresponding first electrode E1 and second electrode E2 for the emission of light from the organic light emission layer OEL.

The thin film transistor TFT includes a gate electrode GE, a semiconductor pattern SM, a source electrode SE and a drain electrode DE.

The gate electrode GE is extruded from a gate line or provided in a partial area of the gate line. The gate electrode GE may be formed by using a metal. The gate electrode GE may be formed by using nickel, chromium, molybdenum, aluminum, titanium, copper, tungsten and an alloy including thereof.

On the gate electrode GE, a gate insulating layer GI is formed. The gate insulating layer GI is provided on the entire surface of the first base substrate SUB1, while covering the gate electrode GE.

The semiconductor pattern SM is provided on the gate insulating layer GI. The semiconductor pattern SM is provided on the gate electrode GE with the gate insulating layer GI therebetween, so that the semiconductor pattern SM is partially overlapped with the gate electrode GE.

The source electrode SE and the drain electrode DE are formed on the semiconductor pattern SM. The source electrode SE is partially overlapped with the gate electrode GE. The drain electrode DE is separately provided from the source electrode SE with the semiconductor pattern SM therebetween. The drain electrode DE is partially overlapped with the gate electrode GE.

The source electrode SE and the drain electrode DE may be formed by using nickel, chromium, molybdenum, aluminum, titanium, copper, tungsten and an alloy including thereof.

A passivation layer 110 may be formed on the source electrode SE and the drain electrode DE. The passivation layer 110 covers the source electrode SE and the drain electrode DE.

The first electrode E1 may be formed on the passivation layer 110. The first electrode E1 is electrically connected to the thin film transistor TFT. The first electrode E1 may include one transparent conductive oxide among indium tin oxide (ITO), indium zinc oxide (IZO), aluminum zinc oxide (AZO), gallium doped zinc oxide (GZO), zinc tin oxide (ZTO), gallium tin oxide (GTO) and fluorine doped tin oxide (FTO), without limitation.

The pixel defining layer PDL may be formed on the first electrode E1. The boundary of the pixel defining layer PDL may have a certain inclination angle. The pixel defining layer PDL exposes the organic light emission layer OEL smoothly formed in the pixel areas PXL. The pixel areas PXL may be defined by the pixel defining layer PDL.

The pixel defining layer PDL may be formed by using one metal-fluoride ionic compound among LiF, $BaF_2$ and CsF. The pixel defining layer PDL has a thickness greater than or equal to about 10 nm and has insulating properties. Particularly, the pixel defining layer PDL has a thickness from about 10 nm to about 100 nm.

The organic light emission layer OEL is formed on the first electrode E1. The organic light emission layer OEL emits light (hereinafter referred to as first light for the sake of convenience). The first light is supplied to the color filter layer 210. The boundary of the organic light emission layer OEL may have a certain inclination angle.

Even though not illustrated, the organic light emission layer OEL may be formed as a multi-layer including a hole injection layer (HIL), a hole transporting layer (HTL), an emission layer (EML), an electron transporting layer (ETL) and an electron injection layer (EIL).

The organic light emission layer OEL may emit white light. For example, the organic light emission layer OEL may have a stacked structure of red, green and blue sub organic light emission layers. In addition, the organic light emission layer OEL may be a single organic light emission layer OEL obtained by doping an organic material with red, green and blue coloring materials.

The second electrode E2 is formed on the pixel defining layer PDL and the organic light emission layer OEL. The second electrode E2 may include one transparent conductive oxide among ITO, IZO, AZO, GZO, ZTO, GTO and FTO, without limitation.

One of the first electrode E1 and the second electrode E2 may be an anode electrode for supplying holes injected into the organic light emission layer OEL, and the other may be a cathode for supplying electrons injected into the organic light emission layer OEL. For example, the first electrode E1 may be the anode, and the second electrode E2 may be the cathode.

The encapsulating layer 220 is formed on the second electrode E2. The encapsulating layer 220 plays the role of passivating the first electrode E1, the organic light emission layer OEL, and the second electrode E2. Even though not illustrated, the encapsulating layer 220 may include an inorganic layer and an organic layer.

The second substrate 200 opposes the first substrate 100.

The second substrate 200 may include a second base substrate SUB2, a black matrix BM and a color filter layer 210.

The second base substrate SUB2 may be a commonly used substrate such as a plastic substrate, a glass substrate and a quartz substrate, without specific limitation. The second base substrate SUB2 may be a transparent insulating substrate.

On the second base substrate SUB2, the black matrix BM and the color filter layer 210 may be formed. Even though not illustrated, on the black matrix BM and the color filter layer 210, an overcoat layer covering the black matrix BM and the color filter layer 210 may be provided.

The black matrix BM may be formed before, after, or together with the formation of the color filter layer 210. The black matrix BM may be formed by forming a light blocking layer absorbing light and patterning the light blocking layer by a photolithography process. Selectively, other methods such as an inkjet method may be used for the formation of the black matrix BM.

The color filter layer 210 may include a plurality of color filters. The black matrix BM may be provided between the color filters.

The color filter layer 210 may receive the first light and include a red color filter 211, a green color filter 212, a blue color filter 213, a white color filter (not shown), etc. In the display device according to an embodiment of the inventive concept, a color filter layer 210 including the red color filter 211, the green color filter 212 and the blue color filter 213 will be explained as an embodiment.

Figure 3:
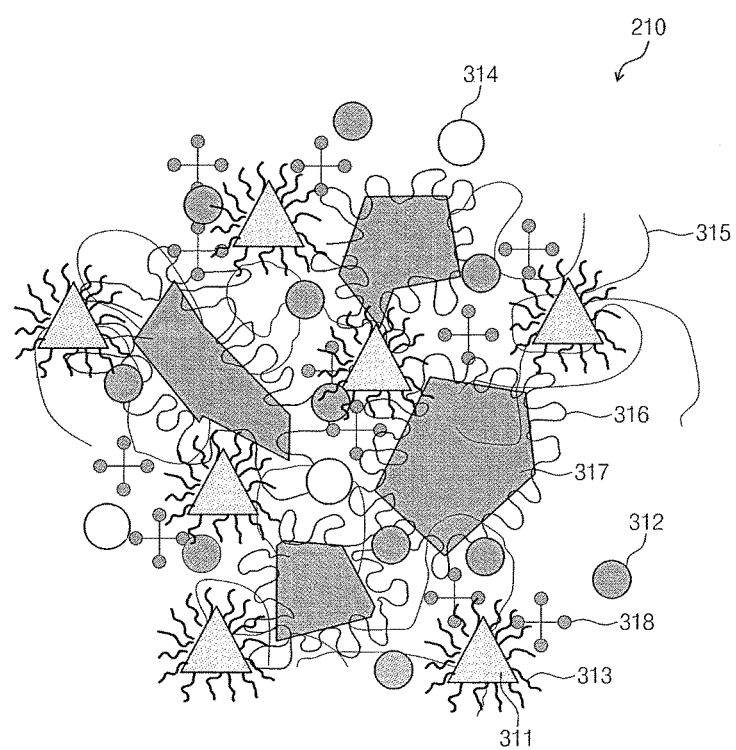
FIG. 3 schematically illustrates constituent materials of a color filter layer included in a display device according to an embodiment of the inventive concept.

FIG. 3 schematically illustrates constituent materials of the color filter layer 210 included in the display device according to an embodiment of the inventive concept.

Referring to FIG. 3, each of the red color filter 211, the green color filter 212 and the blue color filter 213 includes nanoparticles 311 and a fluorescent dye 312. In an embodiment of the inventive concept, each of the red color filter 211, the green color filter 212 and the blue color filter 213 is explained to include the fluorescent dye 312, however may include a quantum dot. In addition, each of the red color filter 211, the green color filter 212 and the blue color filter 213 may further include at least one selected from the group consisting of a leveling agent 313, an initiator 314, a binder polymer 315, a coupling agent 316, a pigment 317, a monomer 318 and a solvent (not shown).

The leveling agent 313 and the nanoparticle 311 may be combined to form a spherical shape. Through the combination of the leveling agent 313 and the nanoparticle 311 into the spherical shape, the distance between the nanoparticles 311 may be maintained. By maintaining the distance between the nanoparticles 311, the gravitation between the nanoparticles 311 may be minimized, and the generation of a surface Plasmon resonance phenomenon may be maximized.

The kind of the leveling agent 313 may be a commonly used one without limitation, and two or more leveling agents 313 may be mixed and used. For example, the leveling agent 313 may include at least one selected from the group consisting of hexane, heptane, octane, nonane, decane, undecane, dodecane, tridecane, tetradecane, pentadecane, hexadecane, cetane, heptadecane, octadecane, nonadecane and icosane.

The kind of the initiator 314 also is not specifically limited, and two or more initiators 314 may be mixed and used. For example, the initiator 314 may include an acetophenone-based compound, a benzophenone-based compound and an oxime-based compound.

The kind of the binder polymer 315 is not specifically limited, and two or more binder polymers 315 may be mixed and used. In addition, the binder polymer 315 may be a copolymer. For example, the binder polymer may include an acrylic polymer and a methacrylic polymer. The weight average molecular weight of the binder polymer 315 may be from about 10,000 to about 100,000.

The kind of the coupling agent 316 is not specifically limited, and two or more coupling agents 316 may be mixed and used. For example, the coupling agent 316 may include a silane-based compound.

The kind of the pigment 317 is not specifically limited. For example, the pigment 317 may include an anthraquinone-based pigment, a condensed polycyclic pigment such as perylene, a phthalocyanine pigment, an azo-based pigment, etc.

The kind of the monomer 318 is not specifically limited, and two or more monomers 318 may be mixed and used. For example, the monomer 318 may include an acrylic monomer.

Two or more solvents may be mixed and used as the solvent (not shown). The solvent may include propylene glycol monomethyl ether acetate (PGMEA), ethyl-3-ethoxy propionate (EEP), ethylene diglycol methyl ethyl ether (EDM), methyl-3-methoxy propionate (NMP), gamma-butyrolactone, N-methyl-pyrrolidone, etc. without limitation.

The color filter layer 210 includes the red color filter layer 211, the green color filter layer 212 and the blue color filter layer 213. Each of the red color filter layer 211, the green color filter layer 212 and the blue color filter layer 213 includes the nanoparticles 311. The nanoparticles 311 include free electrons making collective oscillations in the nanoparticle, that is, Plasmon.

When light (for example, first light emitted from the organic light emission layer OEL) is incident to the nanoparticle 311, this light is defined as incident light, and the angle of the incident light incident to the nanoparticle 311, that is, an angle between a normal line perpendicular to the surface of the nanoparticle 311 and the incident light is defined as an incident angle. The incident light and the phase of the wave of the surface Plasmon of the nanoparticle 311 may coincide in correspondence to a certain value of the incident angle. In this case, the energy of the incident light may be absorbed by the nanoparticle 311, and electric field distribution in a direction perpendicular to the surface of the nanoparticle 311 may increase by exponential functionally and may rapidly decrease along the inner portion of the nanoparticle 311. This phenomenon is called as surface Plasmon resonance, and the incident angle when the surface Plasmon resonance occurs is called as a surface Plasmon resonance angle.

Therefore, a localized field is generated at the surface of the nanoparticle 311 by the surface Plasmon resonance, and the localized field increases the recombination rate of electrons of the fluorescent dye 312. With the increase of the recombination rate of the electrons, the frequency of satisfying the conditions of light emission by the fluorescent dye 312 may be increased. Thus, the light emitting efficiency of the fluorescent dye 312 may be improved by the surface Plasmon resonance at the nanoparticles 311. In addition, the electric field of the first light emitted from the organic light emission layer OEL, the red light, the green light and the blue light may be coupled with Plasmon caused by the surface Plasmon resonance, and light absorption may occur, thereby providing more vivid color.

The surface Plasmon bound to the surface of the nanoparticle 311 may increase the recombination rate of the electrons of the fluorescent dye 312, and the emission efficiency of the red light, the green light and the blue light generated from the fluorescent dye 312 may be increased.

The fluorescent dye 312 may include a commonly used one without specific limitation. For example, Oxatricarbocyanine, Rhodamine B, Nile Blue, Riboflavin, Coumarin 343, perylene, rubrene, anthracene, coronene, phenanthrene, pyrene, butadiens such as 1,4-diphenylbutadiene and tetraphenylbutadiene, stilbene and an analog thereof.

The red color filter 211 exhibits red color and includes a first fluorescent dye 312_R and first nanoparticles 311_R. The surface Plasmon resonance occurs at the first nanoparticles 311_R after receiving the first light.

The first fluorescent dye 312_R receives or absorbs the first light and generates second light having different wavelength from the first light. The first fluorescent dye 312_R may be any one that generates the second light without specific limitation, and the second light may be red light. The first fluorescent dye 312_R may be, for example, Oxatricarbocyanine.

The green color filter 212 exhibits green color and includes a second fluorescent dye 312_G and second nanoparticles 311_G. The surface Plasmon resonance occurs at the second nanoparticles 311_G after receiving the first light.

The second fluorescent dye 312_G receives or absorbs the first light and generates third light having different wavelength from the first light and the second light. The second fluorescent dye 312_G may be any one that generates the third light without specific limitation, and the third light may be green light. The second fluorescent dye 312_G may be, for example, Rhodamine B, Nile Blue and Riboflavin.

The blue color filter 213 exhibits blue color and includes a third fluorescent dye 312_B and third nanoparticles 311_B. The surface Plasmon resonance occurs at the third nanoparticles 311_B after receiving the first light.

The third fluorescent dye 312_B receives or absorbs the first light and generates fourth light having different wavelength from the first light to the third light. The third fluorescent dye 312_B may be any one that generates the fourth light without specific limitation, and the fourth light may be blue light. The third fluorescent dye 312_B may be, for example, Coumarin 343.

The first to third fluorescent dyes 312_R, 312_G and 312_B may have maximum fluorescence intensity in at least one wavelength range among wavelength of light ranging from about 445 nm to about 455 nm, wavelength of light ranging from about 465 nm to about 475 nm, wavelength of light ranging from about 500 nm to about 520 nm, and wavelength of light ranging from about 615 nm to about 625 nm.

The first to third nanoparticles 311_R, 311_G and 311_B may be composed of the same material. Each of the first to third nanoparticles 311_R, 311_G and 311_B may be any one among commonly used materials without specific limitation, and may be a metal selected from the group consisting of Au, Ag, Al, Co, Cu, Cr, Pt, Ni, Fe, Mo and W, or an oxide of the selected metal.

Each of the first to third nanoparticles 311_R, 311_G and 311_B may have a non-spherical shape. Each of the first to third nanoparticles 311_R, 311_G and 311_B may have any non-spherical shape. For example, each of the first to third nanoparticles 311_R, 311_G and 311_B may have various shapes such as a rod, a tetrahedron, a hexahedron, and an octahedron.

The cross-sectional shapes of the first to third nanoparticles 311_R, 311_G and 311_B may be different from each other. The cross-sectional shapes of the first to third nanoparticles 311_R, 311_G and 311_B may have the same number of sides.

Figure 4A:
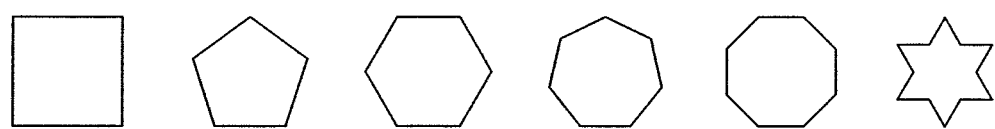
FIGS. 4A and 4B are various schematic cross-sectional shapes of first to third nanoparticles included in a display device according to an embodiment of the inventive concept.
Figure 4B:
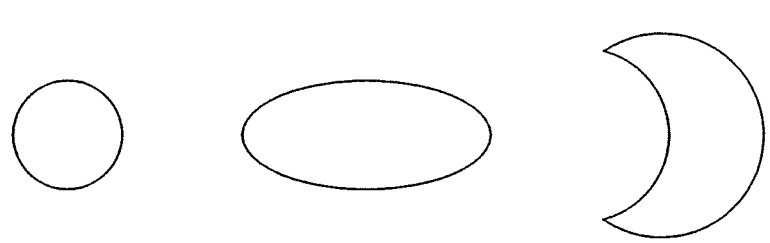

FIGS. 4A and 4B are various schematic cross-sectional shapes of the first to third nanoparticles 311_R, 311_G and 311_B included in a display device according to an embodiment of the inventive concept. Referring to FIG. 4A, the cross-sectional shapes of the first to third nanoparticles 311_R, 311_G and 311_B may have various shapes such as a triangle, a quadrangle, a pentagon, a hexagon, etc. Alternatively, referring to FIG. 4B, the cross-sectional shapes of the first to third nanoparticles 311_R, 311_G and 311_B may have various shapes such as a circle, an ellipse, a mooniness, a semilunar shape, etc. In the display device according to an embodiment of the inventive concept, first to third nanoparticles 311_R, 311_G and 311_B having the cross-sectional shape of a hexagon will be explained.

Figure 5A:
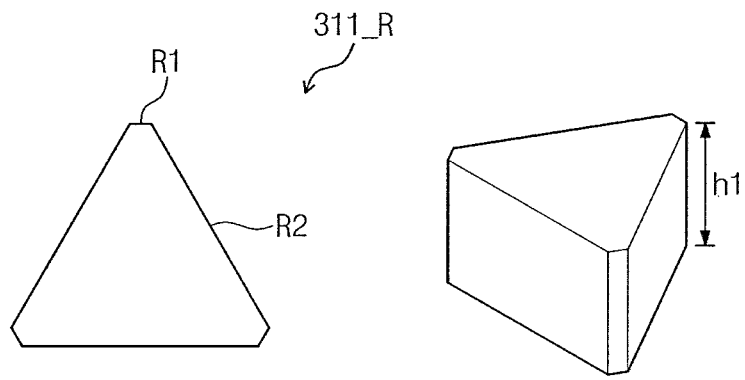
FIGS. 5A, 5B and 5C are schematic cross-sectional views of first to third nanoparticles, respectively, included in a display device according to an embodiment of the inventive concept.
Figure 5B:
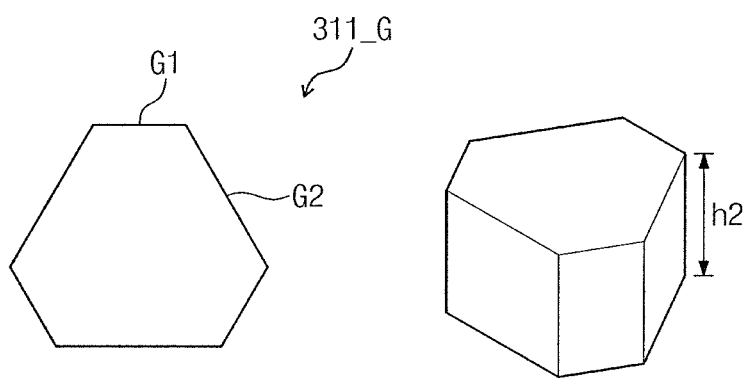
Figure 5C:
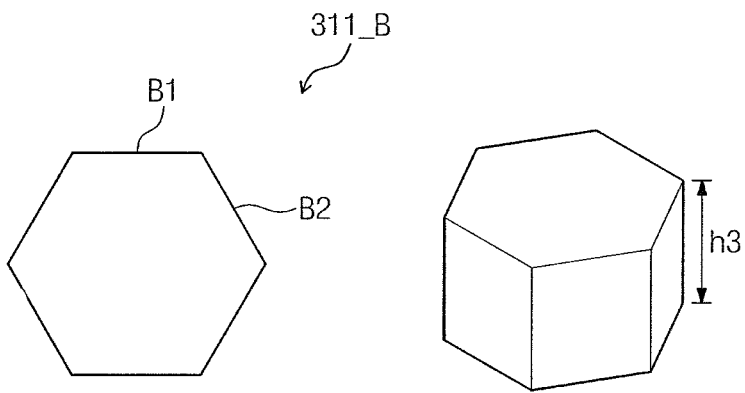

FIGS. 5A, 5B and 5C are schematic cross-sectional views of the first to third nanoparticles 311_R, 311_G and 311_B, respectively, included in a display device according to an embodiment of the inventive concept.

Referring to FIGS. 5A to 5C, the cross-sectional shape of each of the first to third nanoparticles 311_R, 311_G and 311_B may be hexagonal. For example, the cross-sectional shape of the first nanoparticle 311_R may be a first hexagon, the cross-sectional shape of the second nanoparticle 311_R may be a second hexagon, and the cross-sectional shape of the third nanoparticle 311_R may be a third hexagon.

The sizes of the first hexagon, the second hexagon and the third hexagon may be similar. Sides of the first hexagon, the second hexagon and the third hexagon may have lengths ranging from about 70 nm to about 130 nm to cause surface Plasmon resonance phenomenon sufficiently.

In the embodiments illustrated in FIGS. 5A to 5C, each of the first to third nanoparticles 311_R, 311_G and 311_B may have a prism shape. In this case, the height h1 of the first nanoparticle 311_R, the height h2 of the second nanoparticle 311_G, and the height h3 of the third nanoparticle 311_B may be substantially the same.

The first hexagon may include a first side R1 and a second side R2 connected to each other, the second hexagon may include a first side G1 and a second side G2 connected to each other, and the third hexagon may include a first side B1 and a second side B2 connected to each other.

When the length of the first side R1/the length of the second side R2 of the first nanoparticle is A, the length of the first side G1/the length of the second side G2 of the second nanoparticle is B, and the length of the first side B1/the length of the second side B2 of the third nanoparticle is C, |A−1|>|B−1|>|C−1| may be satisfied. That is, the third hexagon may be closer to a regular hexagon than the second hexagon, and the second hexagon may be closer to a regular hexagon than the first hexagon. When the first to third nanoparticles 311_R, 311_G and 311_B have a prism shape, and the heights thereof are substantially the same, the extinction of the first to third nanoparticles 311_R, 311_G and 311_B may be determined by the cross-sectional shape thereof.

Referring to the following Equation 1, the extinction cross-section of the nanoparticle 311 is the sum of the scattering cross-section of the nanoparticle 311 and the absorption cross-section of the nanoparticle 311.

$$\sigma_{Ext}=\sigma_{Abs}+\sigma_{Sca} \quad [\text{Equation 1}]$$

$\sigma_{Ext}$: Extinction cross-section
$\sigma_{Sca}$: Scattering cross-section
$\sigma_{Abs}$: Absorption cross-section Referring to the following Equations 2 and 3, the scattering cross-section of the nanoparticle 311 may be obtained through the following Equation 2, and the absorption cross-section of the nanoparticle 311 may be obtained through the following Equation 3.

$$\sigma_{Sca} = \frac{8\pi}{3}\kappa^4 \alpha_1^2 \alpha_2^2 \alpha_3^2 \left|\frac{\varepsilon-\varepsilon_m}{\varepsilon+2\varepsilon_m}\right| \quad [\text{Equation 2}]$$

$\kappa$: $2\pi/\lambda$ ($\lambda$: wavelength of light)
$\alpha$: Radius of each axis of a nanoparticle $$\sigma_{Abs} = 4\pi k a_1 a_2 a_3 Im\left|\frac{\varepsilon-\varepsilon_m}{\varepsilon+2\varepsilon_m}\right| \quad [\text{Equation 3}]$$

$\kappa$: $2\pi/\lambda$ ($\lambda$: wavelength of light)

$\alpha$: Radius of each axis (x axis, y axis and z axis: x, y and z axes are perpendicular to each other) of a nanoparticle
$\in$: Dielectric constant of nanoparticle
$\in_m$: Dielectric constant of the surrounding medium of the nanoparticle Referring to the above Equations 2 and 3, the absorption cross-section of the nanoparticle 311 may be changed depending on the radius of each axis of the nanoparticle 311, and the scattering cross-section of the nanoparticle 311 and the absorption cross-section of the nanoparticle 311 may be changed depending on the shape of the first to third nanoparticles 311_R, 311_G and 311_B. In addition, referring to the above Equation 1, the extinction cross-section of the nanoparticle 311 may be changed according to the change of the scattering cross-section of the nanoparticle 311 and the absorption cross-section of the nanoparticle 311. For example, the extinction cross-section of the nanoparticle 311 may increase in the case when one of the scattering cross-section of the nanoparticle 311 and the absorption cross-section of the nanoparticle 311 increases.

Referring to the above Equations 1 to 3, the nanoparticle having a non-spherical shape but near a spherical shape, or having a longer radius of one axis than the radius of another axis, the scattering cross-section and the absorption cross-section may increase, and thus, the extinction cross-section may also increase.

Referring to the following Equation 4, as the absorption cross-section of the nanoparticle 311 increases, the intensity of a fluorescent dye may be increased. That is, when the absorption cross-section of the nanoparticle 311 increases, the extinction cross-section of the nanoparticle 311 may be increased, and so, the intensity of the fluorescent dye may be increased.

$$P_{Fluo}=Q\sigma_{Abs}(\omega_L)S_{Inc}=QM_{Loc}(\omega_L)\sigma_{Abs}^0(\omega_L)S_{Inc} \quad [\text{Equation 4}]$$

$P_{Fluo}$: Intensity of fluorescent dye
Q: Quantum yield of fluorescent dye (eigenvalue of fluorescent dye)
$M_{Loc}$: Local field intensity enhancement factor
$\omega_L$: Frequency
$\sigma_{Abs}$: Enhanced absorption cross-section
$\sigma_{Abs}^0$: Absorption cross-section
$S_{Inc}$: Excitation density of electrons Referring to the above Equations 1 to 4, the extinction of the first to third nanoparticles 311_R, 311_G, and 311_B is determined by the cross-sectional shape thereof.

In addition, since the first to third nanoparticles 311_R, 311_G, and 311_B are included in the red color filter 211, the green color filter 212 and the blue color filter 213, respectively, the wavelength range having maximum extinction may be different from each other. In one embodiment, the first to third nanoparticles 311_R, 311_G, and 311_B have the maximum extinction at a first wavelength, a second wavelength and a third wavelength, respectively. The first wavelength is bigger than the second wavelength, and the second wavelength is bigger than the third wavelength.

The first wavelength to the third wavelength may be in the wavelength range of red light, the wavelength range of green light, and the wavelength range of blue light, respectively. For example, the first wavelength may be greater than about 600 nm and less than about 750 nm, the second wavelength may be greater than about 500 nm and less than about 550 nm, and the third wavelength may be greater than about 430 nm and less than about 480 nm.

Referring to the above Equations 1 to 4, the shapes of the first to third nanoparticles 311_R, 311_G, and 311_B are different from each other and so, have different extinction values. More particularly, the third hexagon closest to a regular hexagon among the first to third nanoparticles 311_R, 311_G, and 311_B has the smallest multiplied value of the radii of the axes, and may have the lowest extinction. In addition, the first hexagon most distant from a regular hexagon has the biggest multiplied value of the radii of axes, and has the highest extinction. In addition, the wavelength ranges of the first to third nanoparticles 311_R, 311_G, and 311_B having maximum extinction may also be different. The first nanoparticle 311_R having the highest extinction at the highest wavelength range are included in the red color filter 211, the second nanoparticle 311_G having the highest extinction at the middle wavelength range are included in the green color filter 212, and the third nanoparticle 311_B having the highest extinction at the lowest wavelength range are included in the blue color filter 213.

In embodiments, nanoparticle 311 having a non-spherical shape but close to a spherical shape and having a longer radius of one axis than the radius of another axis, for example, the third nanoparticle 311_B has maximum extinction at relatively low wavelength. More particularly, when the length of a first side B1/the length of a second side B2 of the third nanoparticle is C, the difference from 1 is the smallest for the third nanoparticle 311_B. Thus, the third nanoparticle 311_B may have the smallest multiplied value of the radii of the axes, and may have maximum extinction at a lower wavelength range. When the length of a first side R1/the length of a second side R2 is A, the difference from 1 is the biggest for the first nanoparticle 311_R. Thus, the first nanoparticle 311_R may have the biggest multiplied value of the radii of the axes, and may have maximum extinction at a higher wavelength range. Accordingly, the first nanoparticle 311_R having maximum extinction at the highest wavelength range are included in the red color filter 211, the second nanoparticle 311_G having maximum extinction at a middle wavelength range are included in the green color filter 212, and the third nanoparticle 311_B having maximum extinction at the lowest wavelength range are included in the blue color filter 213.

The efficiency of the fluorescent dye used in each color filter may be maximized by using nanoparticle having different shapes by the color filters and having maximum extinction in a specific wavelength range in the display device according to an embodiment of the inventive concept. By maximizing the efficiency of the fluorescent dye, the luminance of the color filter may be enhanced, and a display device having high color purity and high luminance may be provided.

Figure 6A:
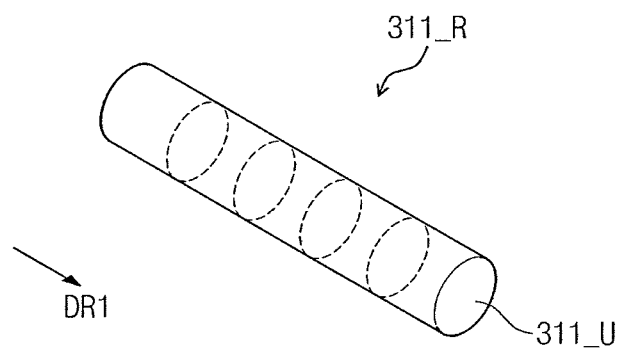
FIGS. 6A to 6C are schematic cross-sectional views of first to third nanoparticles, respectively, included in a display device according to an embodiment of the inventive concept.
Figure 6B:
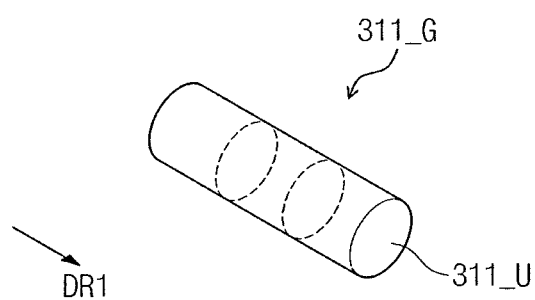
Figure 6C:
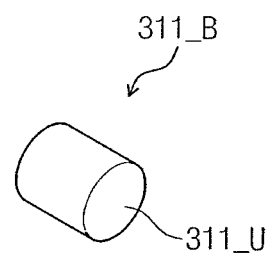

FIGS. 6A to 6C are schematic cross-sectional views of first to third nanoparticles 311_R, 311_G, and 311_B, respectively, included in a display device according to an embodiment of the inventive concept.

Referring to FIGS. 6A to 6C, the first nanoparticle 311_R may have a pillar shape as if a plural number of unit nanoparticle blocks 311_U are aligned and integrated. The unit nanoparticle block 311_U is nano-sized and has a non-spherical shape. Likewise, the second nanoparticle 311_G may have a pillar shape as if a plural number of the same unit nanoparticle blocks 311_U are aligned and integrated. The third nanoparticle 311_B may have a pillar shape as if it includes one unit nanoparticle block 311_U or as if it includes a plural number of the same unit nanoparticle blocks 311_U. Where the number of the unit nanoparticle blocks 311_U in the first nanoparticle 311_R is "a" ("a" is a natural number), the number of the unit nanoparticle blocks 311_U in the second nanoparticle 311_G is "b" ("b" is a natural number), and the number of the unit nanoparticle blocks 311_U in the third nanoparticle 311_G is "c" ("c" is a natural number), "a" is greater than "b" which is greater than "c" (i.e., a>b>c). Each of the first to third nanoparticles 311_R, 311_G, and 311_B may be formed by extending the unit nanoparticle blocks 311_U in one direction (for example, DR1 in FIGS. 6A and 6B). For example, the first nanoparticle 311_R may be formed by extending five non-spherical unit nanoparticle blocks 311_U, and the second nanoparticle 311_G may be formed by extending two non-spherical unit nanoparticle blocks 311_U, and the third nanoparticle 311_B may include one non-spherical unit nanoparticle block 311_U.

The cross-section of the unit nanoparticle block 311_U may have one of various shapes. Referring to FIG. 4A again, the unit nanoparticle block 311_U may have one of various cross-sectional shapes such as a triangle, a quadrangle, a pentagon, a circle, an ellipse, a semilunar shape, etc. Referring to FIG. 4B, the unit nanoparticle block 311_U may have a curvature.

When the unit nanoparticle block 311_U has a circular cross-section, the diameter of the circle may be from about 50 nm to about 60 nm.

Referring to FIGS. 1 to 4, the first to third nanoparticles 311_R, 311_G, and 311_B have different shapes and different extinction. More particularly, the third nanoparticle 311_B including the smallest number of the unit nanoparticle blocks 311_U among the first to third nanoparticles 311_R, 311_G, and 311_B has the smallest multiplied value of the radii of axes, and so may have low extinction. In addition, the first nanoparticle 311_R including the largest number of the unit nanoparticle blocks has the biggest multiplied value of the radii of axes, and so may have high extinction. In addition, the wavelength range having the maximum extinction is different by the first to third nanoparticles 311_R, 311_G, and 311_B. The first nanoparticle 311_R having the maximum extinction at the highest wavelength range are included in the red color filter 211, the second nanoparticle 311_G having the maximum extinction at the middle wavelength range are included in the green color filter 212, and the third nanoparticle 311_B having the maximum extinction at the lowest wavelength range are included in the blue color filter 213.

The nanoparticle having a longer radius of one axis than the radius of another axis, for example, the third nanoparticle 311_B, have the maximum extinction at relatively low wavelength. More particularly, the third nanoparticle 311_B having the smallest length in the extended direction of the unit nanoparticle block 311_U have the smallest multiplied value of the radii of the axes, and have the maximum extinction at a lower wavelength range. In addition, the first nanoparticle 311_R having the biggest length in the extended direction of the unit nanoparticle block 311_U has the biggest multiplied value of the radii of the axes, and has the maximum extinction at a higher wavelength range. Therefore, the first nanoparticle 311_R having the maximum extinction at the highest wavelength range are included in the red color filter 211, the second nanoparticle 311_G having the maximum extinction at a middle wavelength range are included in the green color filter 212, and the third nanoparticle 311_B having the maximum extinction at the lowest wavelength range are included in the blue color filter 213.

Figure 7:
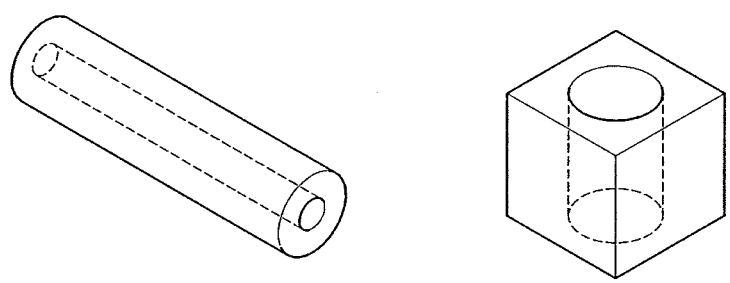
FIG. 7 illustrates various schematic shapes of first to third nanoparticles included in a display device according to an embodiment of the inventive concept.

FIG. 7 illustrates various schematic shapes of first to third nanoparticles 311_R, 311_G, and 311B included in a display device according to an embodiment of the inventive concept.

Referring to FIG. 7, each of the first to third nanoparticles 311_R, 311_G, and 311B may include empty space therein. The shape of the empty space may have various shapes such as a spherical shape, etc. without specific limitation. In this case, the volume of the empty space may be substantially the same, however the present invention is not limited thereto. When the first wavelength is the biggest, and the third wavelength is the smallest, the volume of the empty space of each of the first to third nanoparticles 311_R, 311_G, and 311B may be different.

The maximization of the efficiency of the fluorescent dye by the color filters using nanoparticle having the same shape, that is, the same spherical shape by the color filters is difficult in a common display device. However, in the display device according to an embodiment of the inventive concept, the nanoparticle has different shapes by the color filters, and nanoparticles having the maximum extinction in a specific wavelength range are used. Thus, the efficiency of the fluorescent dye used by the color filters may be maximized. Through the maximization of the efficiency of the fluorescent dye, the luminance of the color filter may be enhanced, and a display device having high color purity and high luminance may be provided.

Hereinafter, the inventive concept will be particularly described referring to embodiments. However, the following embodiments are illustrated to assist the understanding of the inventive step, and the scope of the inventive concept is not limited thereto.

EXAMPLES

Example 1

Figure 8A:
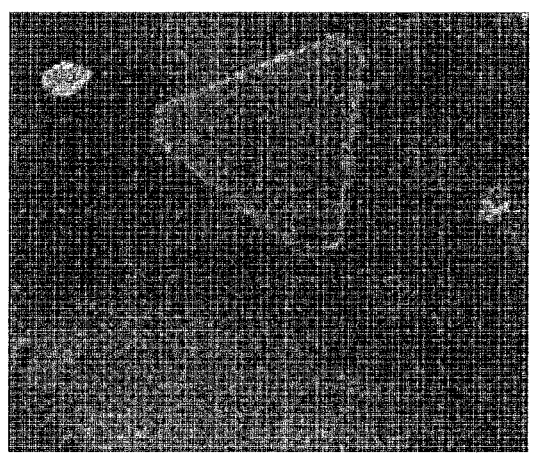
FIGS. 8A to 8C are SEM photographic images of first to third nanoparticles, respectively, according to Example 1.
Figure 8B:
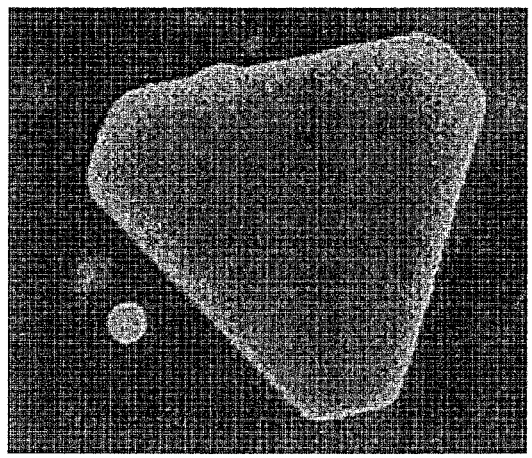
Figure 8C:
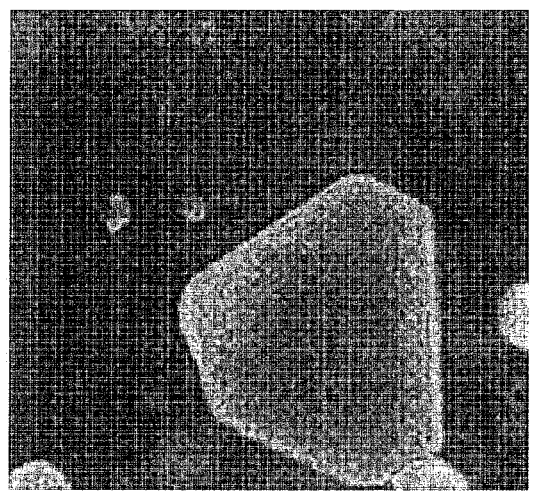

First to third nanoparticles composed of Ag and having a hexagonal cross-section were prepared. FIGS. 8A to 8C are SEM photographic images of first to third nanoparticles according to Example 1, respectively. Referring to FIGS. 8A to 8C, it may be secured that the cross-section of the third nanoparticle in FIG. 8C is the closest to a circular shape, and the cross-section of the first nanoparticle in FIG. 8A is the most distant from the circular shape. Each of the first to third nanoparticles had an average size from about 70 nm to about 130 nm.

Figure 9A:
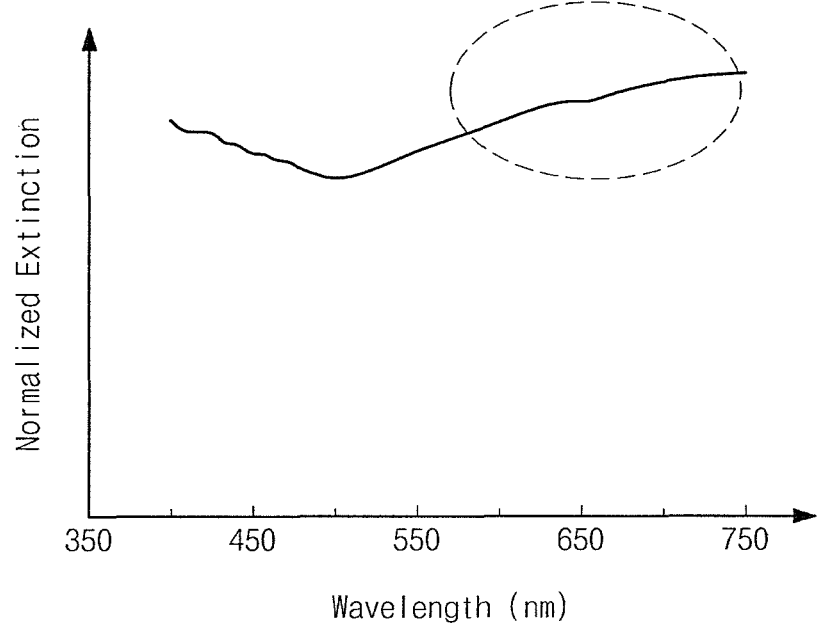
FIGS. 9A to 9C are graphs illustrating extinction of first to third nanoparticles, respectively, according to Example 1 with respect to wavelength.
Figure 9B:
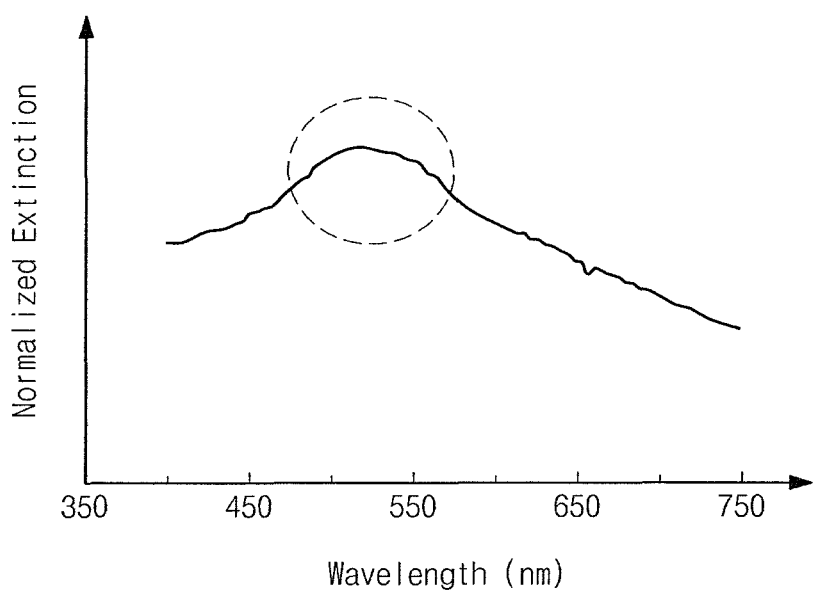
Figure 9C:
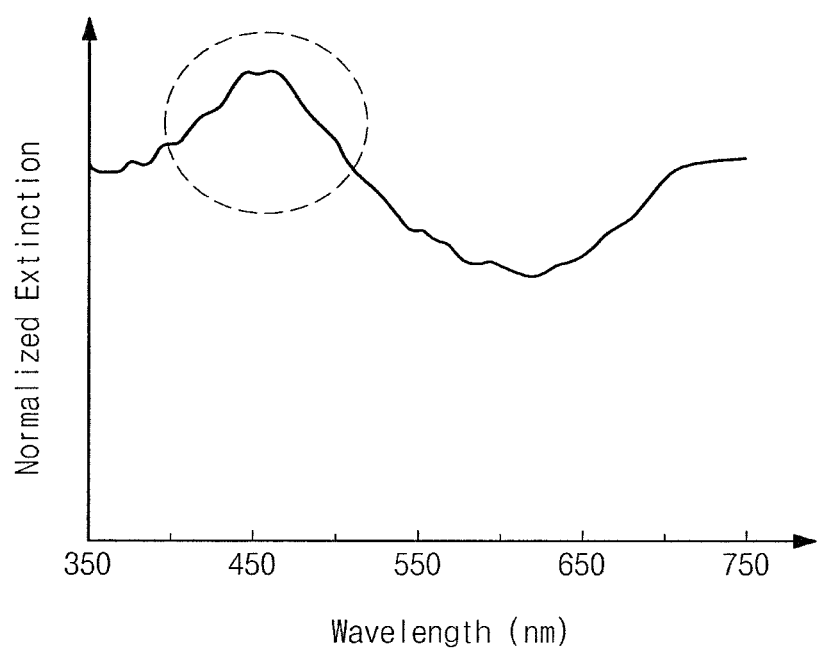
Figure 10A:
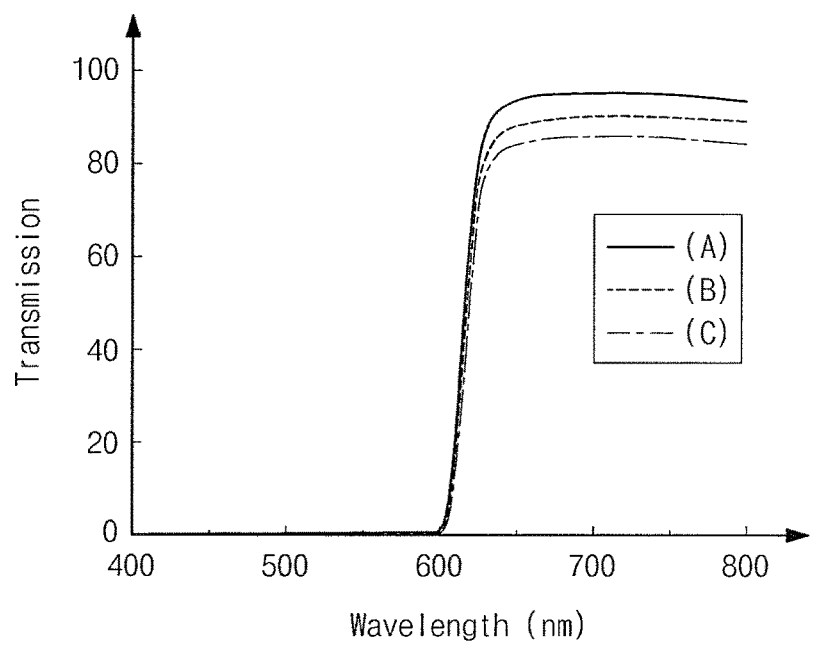
FIGS. 10A to 10C are graphs illustrating transmission of first to third nanoparticles according to Example 1 with respect to wavelength.
Figure 10B:
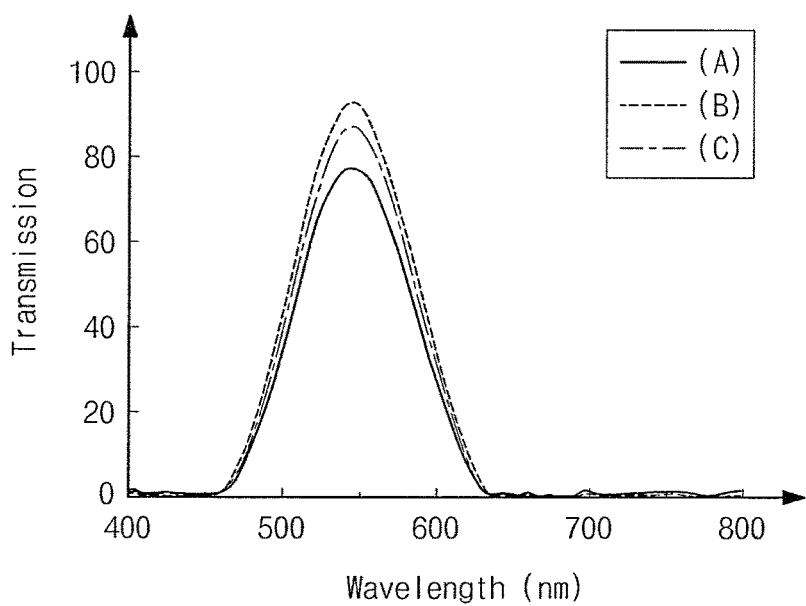
Figure 10C:
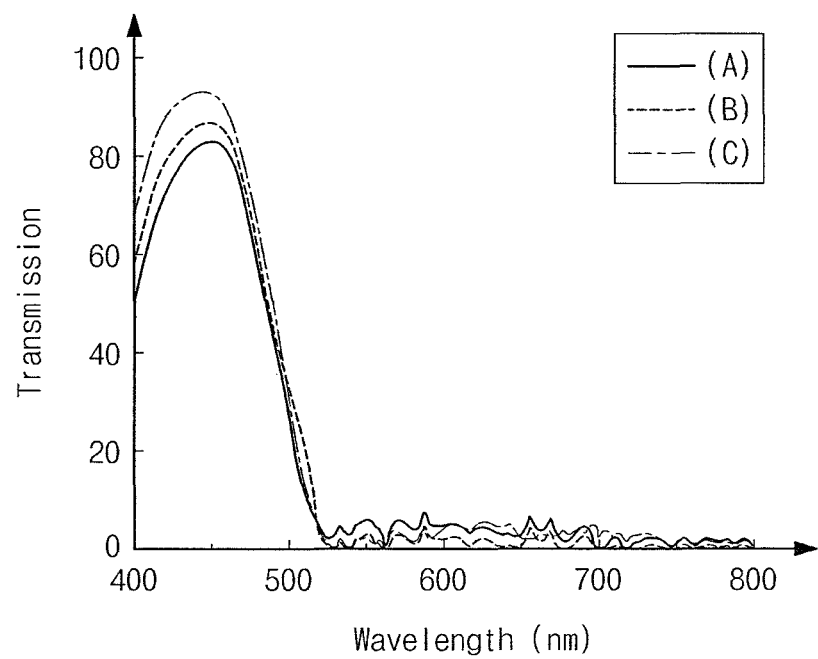

The extinction of each of the first to third nanoparticles with respect to wavelengths was measured and illustrated in FIGS. 9A to 9C, respectively, and the transmission of each of the first to third nanoparticles with respect to wavelengths was measured and illustrated in FIGS. 10A to 10C. A corresponds to the first nanoparticle, B corresponds to the second nanoparticle, and C corresponds to the third nanoparticle in FIGS. 10A to 10C.

Figure 11A:
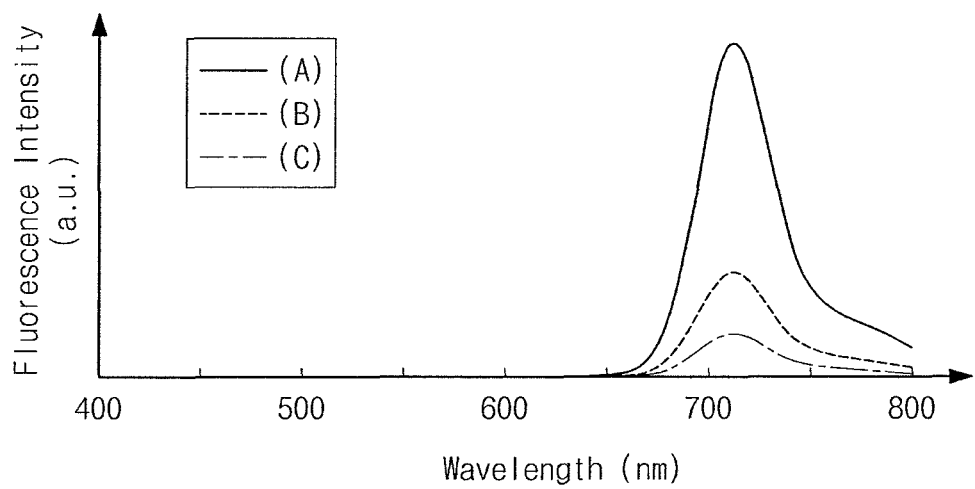
FIGS. 11A to 11D are graphs illustrating fluorescence intensity of a color filter including first to third nanoparticles according to Example 1 with respect to wavelength.

The first nanoparticle and Oxatricarbocyanine as the first fluorescent dye were used, and the fluorescence intensity with respect to wavelength was measured and illustrated in FIG. 11A.

Figure 11B:
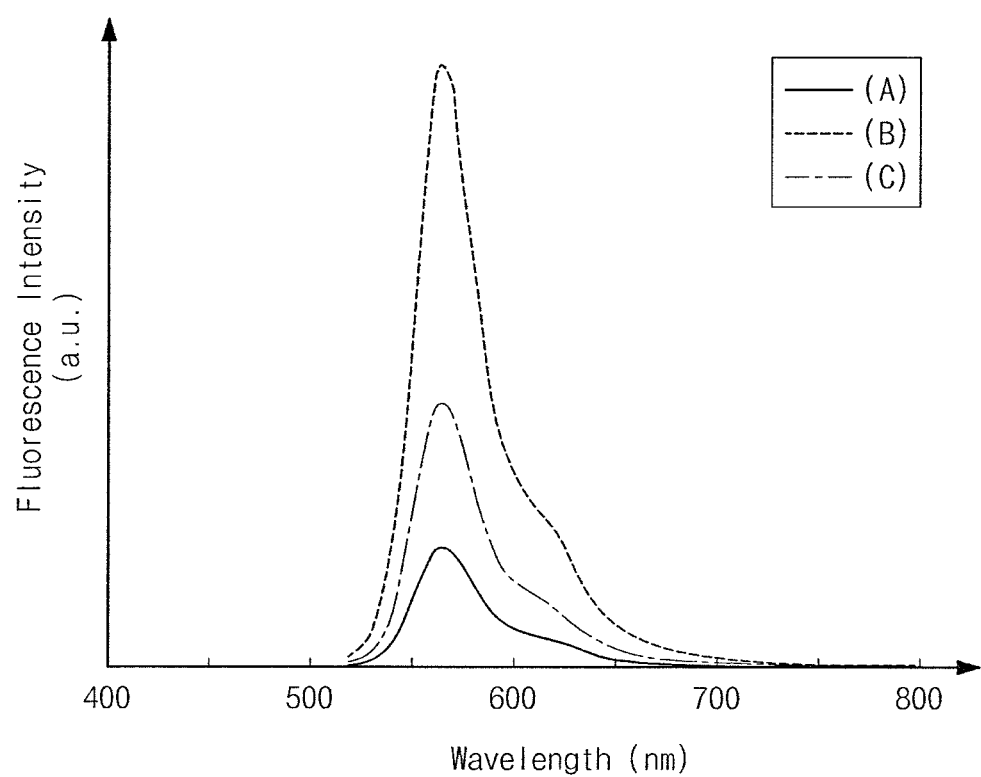

The second nanoparticle and Rhodamine B as the second fluorescent dye were used, and the fluorescence intensity with respect to wavelength was measured and illustrated in FIG. 11B. The second nanoparticle and Riboflavin as the second fluorescent dye were used, and the fluorescence intensity with respect to wavelength was measured and illustrated in FIG. 11C.

Figure 11C:
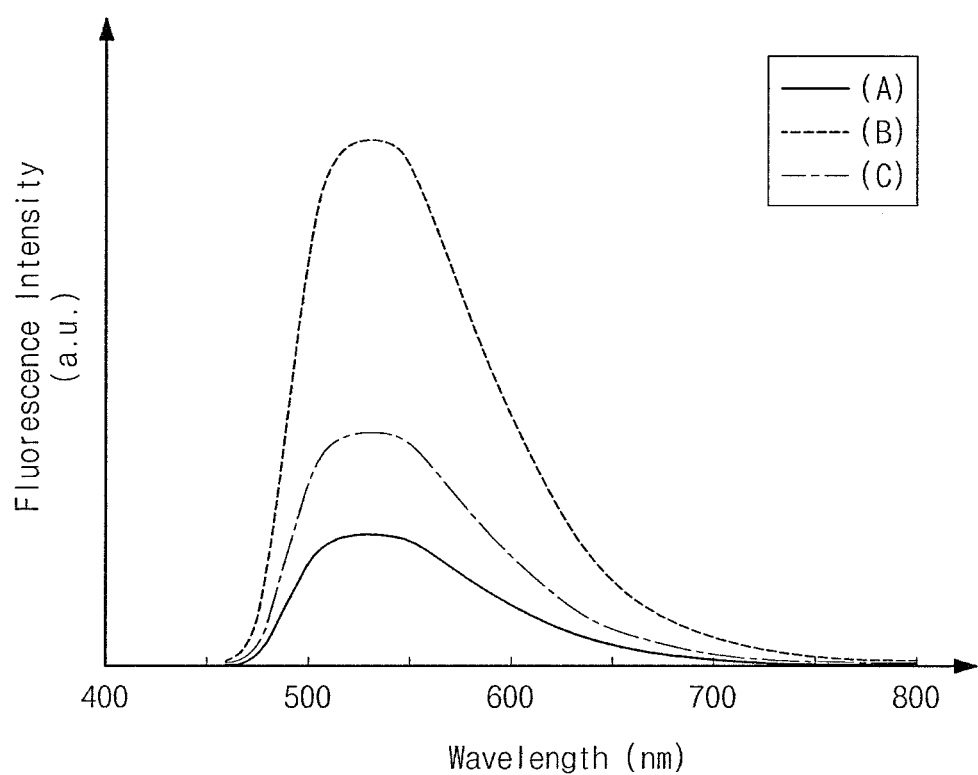
Figure 11D:
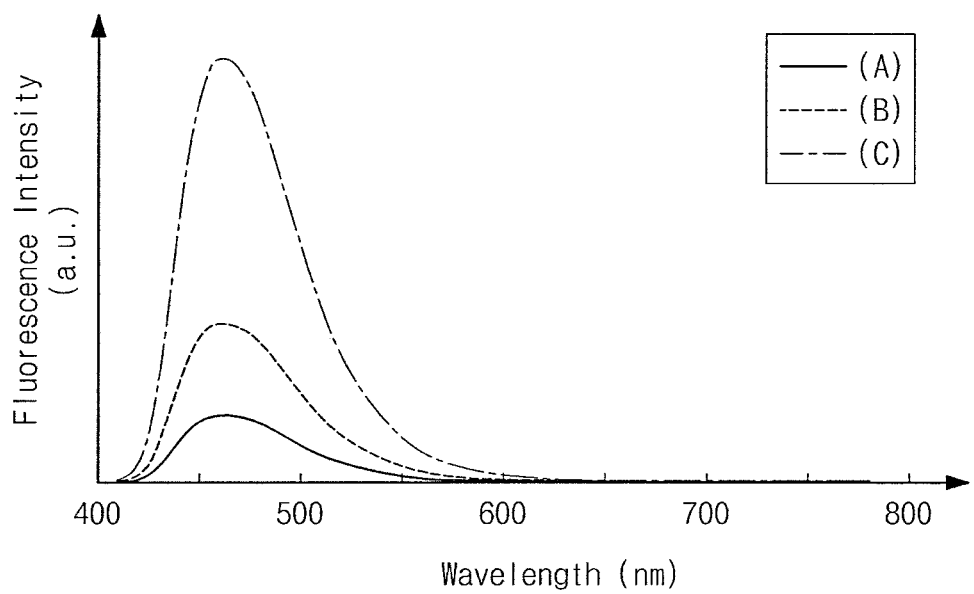

The third nanoparticle and Coumarin 343 as the third fluorescent dye were used, and the fluorescence intensity with respect to wavelength was measured and illustrated in FIG. 11D.

A corresponds to the first nanoparticle, B corresponds to the second nanoparticle, and C corresponds to the third nanoparticle in FIGS. 11A to 11D.

Example 2

Figure 12A:
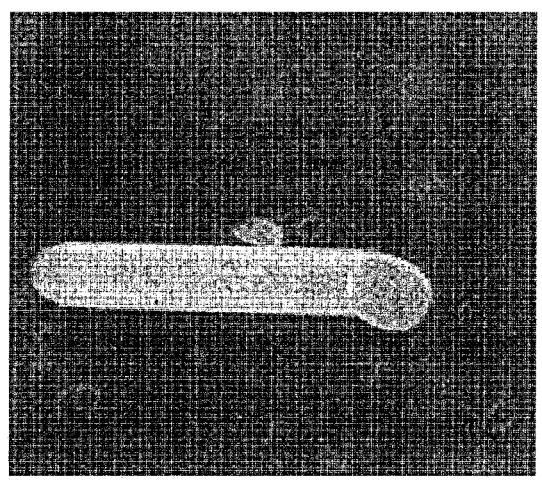
FIGS. 12A to 12C are SEM photographic images of first to third nanoparticles according to Example 2, respectively.
Figure 12B:
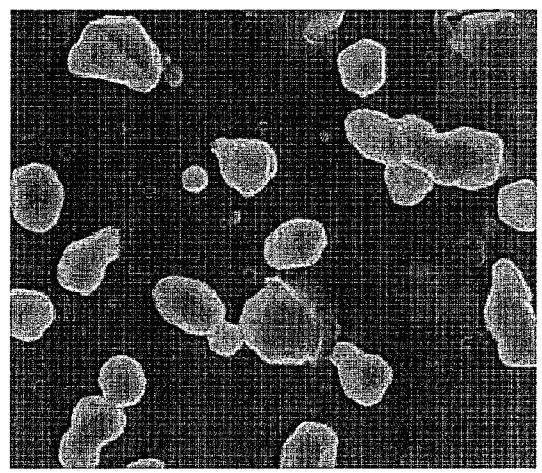
Figure 12C:
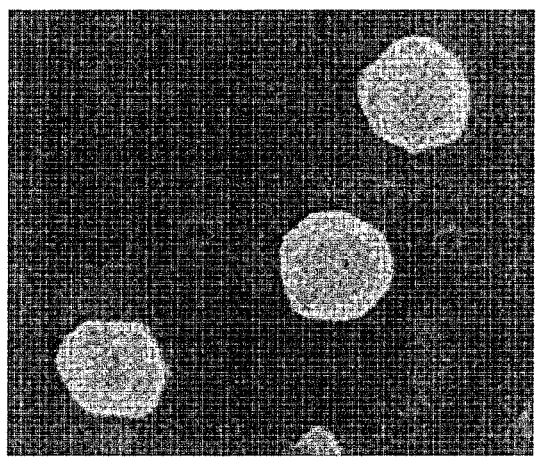

A first nanoparticle obtained by connecting five unit blocks, a second nanoparticle obtained by connecting two unit blocks, and a third nanoparticle including one unit nanoparticle, and composed of Ag were prepared. FIGS. 12A to 12C are SEM photographic images of the first to third nanoparticles according to Example 2, respectively. Referring to FIGS. 12A to 12C, it may be secured that the first nanoparticle has the biggest length in the combining direction of the unit nanoparticles, and the third nanoparticle has the smallest length in the combining direction of the unit nanoparticles. The first to third nanoparticles have an average size from about 70 nm to about 130 nm.

Figure 13A:
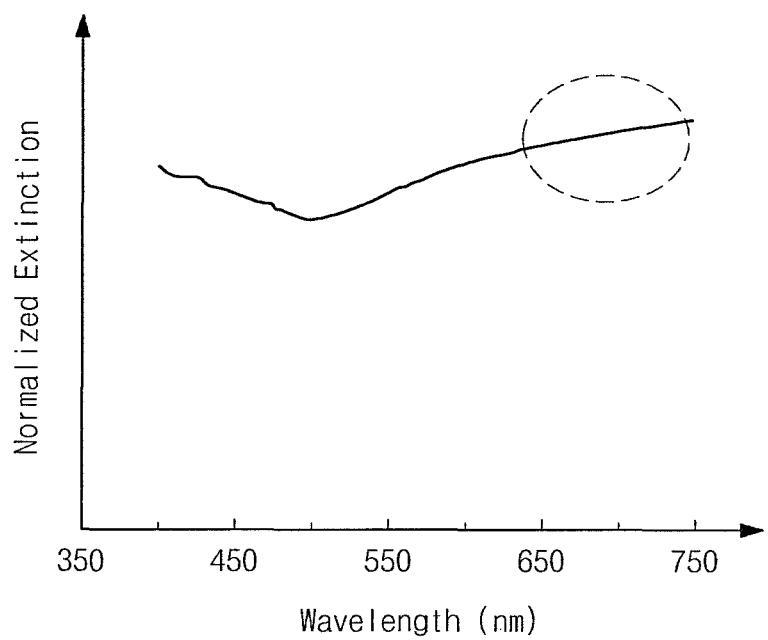
FIGS. 13A to 13C are graphs illustrating extinction of first to third nanoparticles according to Example 2, respectively with respect to wavelength.
Figure 13B:
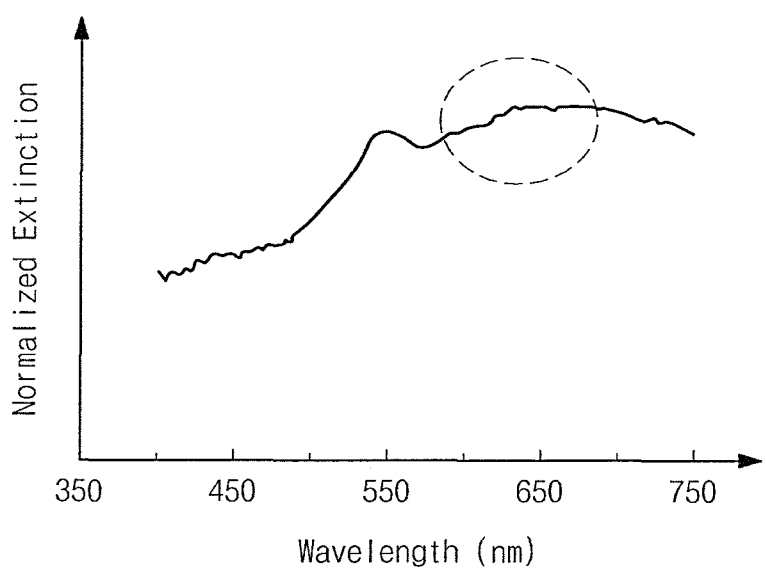
Figure 13C:
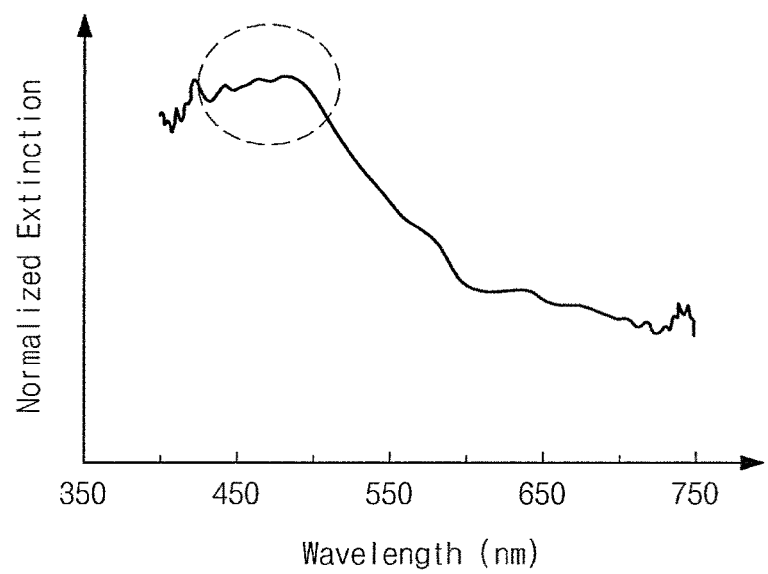
Figure 14A:
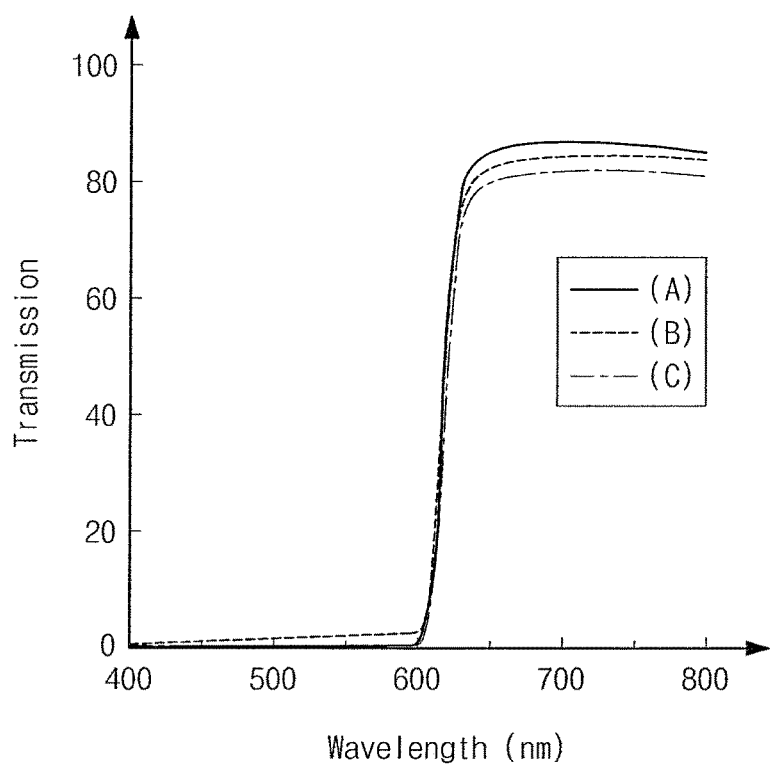
FIGS. 14A to 14C are graphs illustrating transmission of first to third nanoparticles according to Example 2 with respect to wavelength.
Figure 14B:
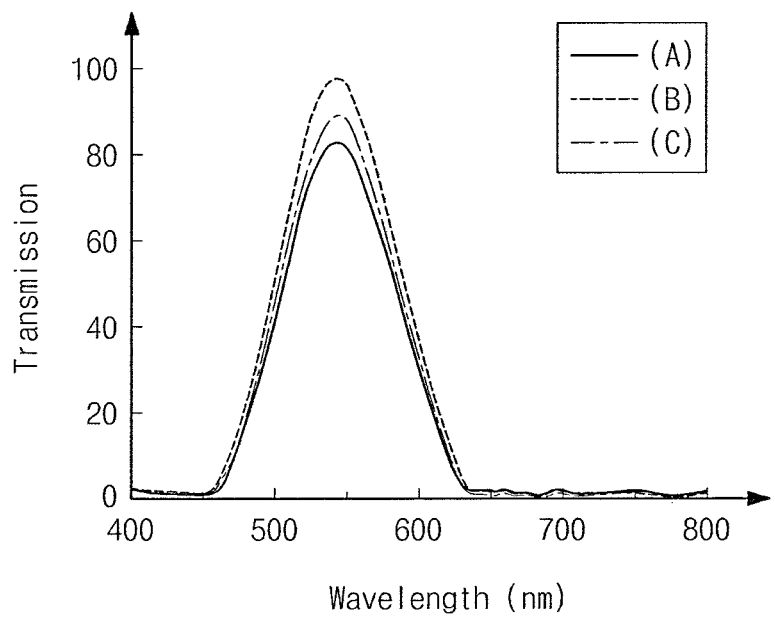
Figure 14C:
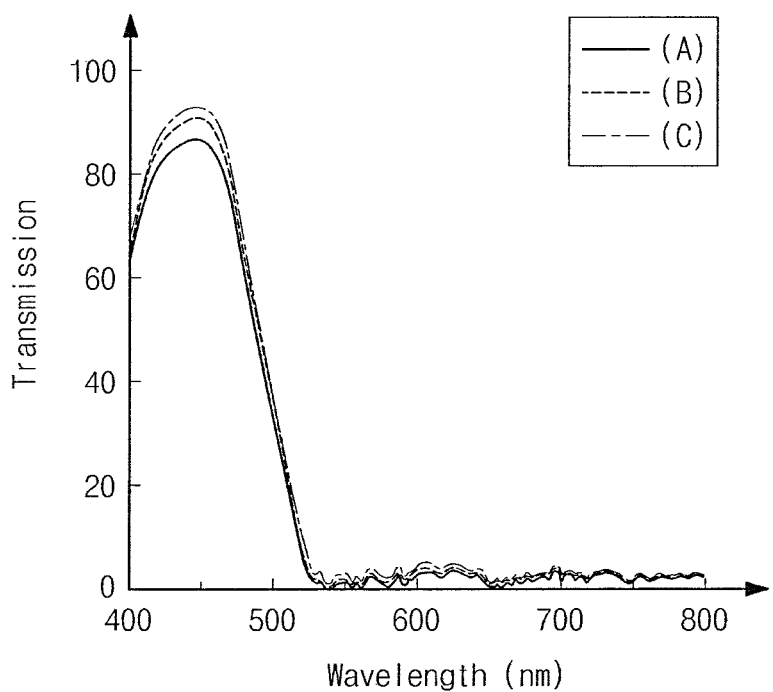

The extinction of each of the first to third nanoparticles with respect to wavelengths was measured and illustrated in FIGS. 13A to 13C, respectively, and the transmission of each of the first to third nanoparticles with respect to wavelengths was measured and illustrated in FIGS. 14A to 14C. A corresponds to the first nanoparticle, B corresponds to the second nanoparticle, and C corresponds to the third nanoparticle in FIGS. 14A to 14C.

Figure 15A:
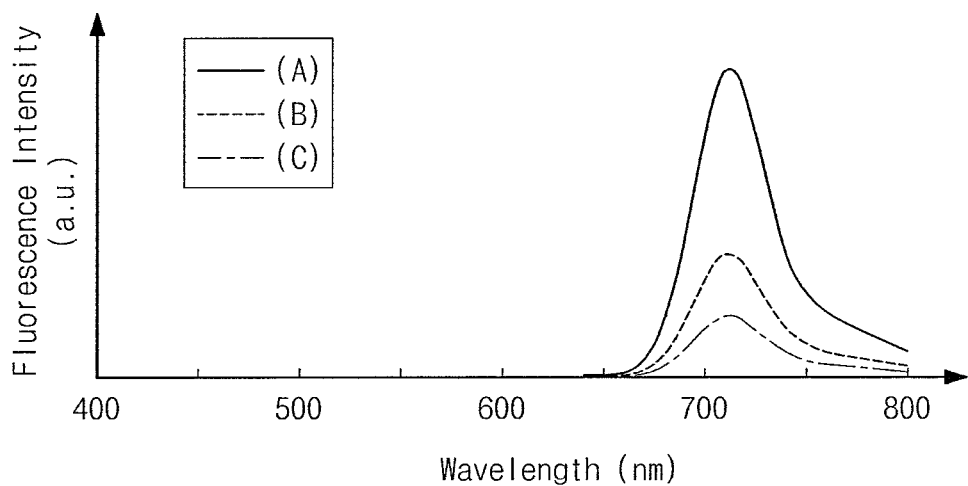
FIGS. 15A to 15C are graphs illustrating fluorescence intensity of a color filter including first to third nanoparticles according to Example 2 with respect to wavelength.

The first nanoparticle and Oxatricarbocyanine as the first fluorescent dye were used, and the fluorescence intensity with respect to wavelength was measured and illustrated in FIG. 15A.

Figure 15B:
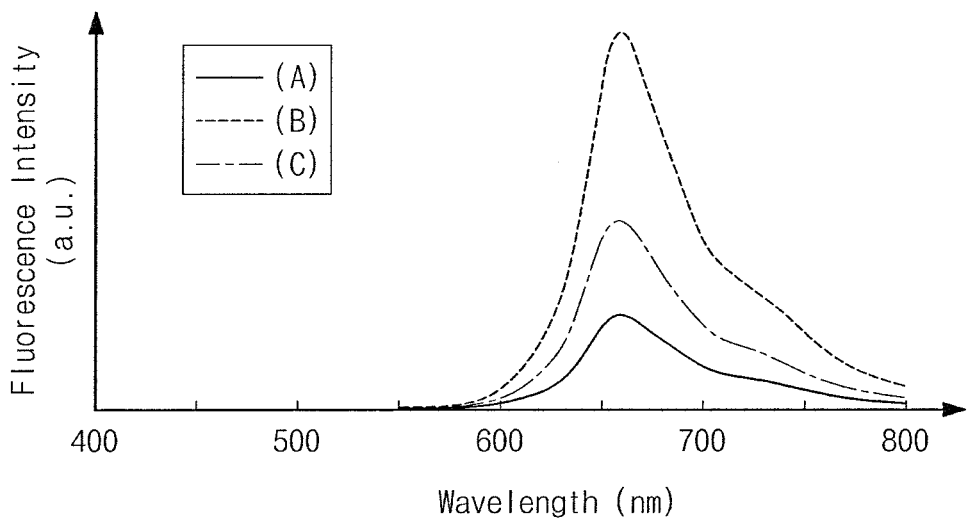

The second nanoparticle and Nile Blue as the second fluorescent dye were used, and the fluorescence intensity with respect to wavelength was measured and illustrated in FIG. 15B.

Figure 15C:
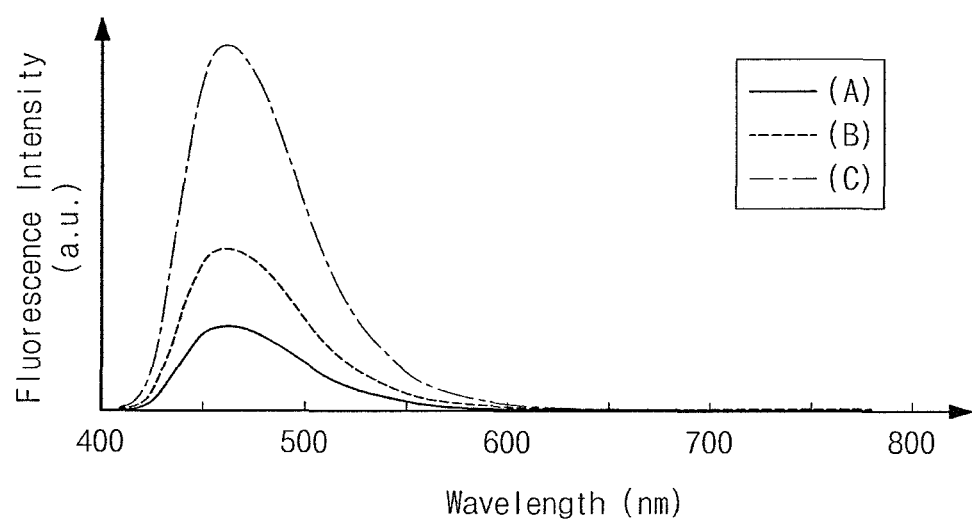

The third nanoparticle and Coumarin 343 as the third fluorescent dye were used, and the fluorescence intensity with respect to wavelength was measured and illustrated in FIG. 15C.

A corresponds to the first nanoparticle, B corresponds to the second nanoparticle, and C corresponds to the third nanoparticle in FIGS. 15A to 15C.

Experimental Results

Experimental Results of Example 1

FIGS. 9A to 9C are graphs illustrating extinction with respect to the wavelength of first to third nanoparticles according to Example 1, respectively. Referring to FIGS. 9A to 9C, the first nanoparticle having the most distant cross-sectional shape from a circle has the maximum extinction in the highest wavelength range, and the third nanoparticle having the closest cross-sectional shape to the circle has the maximum extinction in the lowest wavelength range.

FIGS. 10A to 10C are graphs illustrating transmission of first to third nanoparticles according to Example 1 with respect to the wavelength, respectively. Referring to FIG. 10A, the first nanoparticle A having the most distant cross-sectional shape from a circle have the highest transmission in a high wavelength range. Referring to FIG. 10B, the second nanoparticle B have the highest transmission in a middle wavelength range. Referring to FIG. 10C, the third nanoparticle C having the closest cross-sectional shape to the circle have the highest transmission in the lowest wavelength range.

FIGS. 11A to 11D are graphs illustrating fluorescence intensity of color filters including the first to third nanoparticles according to Example 1 with respect to the wavelength, respectively. Referring to FIG. 11a, it may be secured that the first nanoparticle having the most distant cross-sectional shape from a circle may maximize the fluorescence intensity of Oxatricarbocyanine. Referring to FIGS. 11B and 11C, it may be secured that the second nanoparticle may maximize the fluorescence intensity of Rhodamine B and Riboflavin. Referring to FIG. 11D, it may be secured that the third nanoparticle may maximize the fluorescence intensity of Coumarin 343.

Experimental Results of Example 2

FIGS. 13A to 13C are graphs illustrating extinction of the first to third nanoparticles according to Example 2 with respect to wavelength, respectively. Referring to FIGS. 13A to 13C, it may be secured that the first nanoparticle having the biggest length in the combining direction of the unit nanoparticles have the maximum extinction in the highest wavelength range, and the third nanoparticle having the smallest length in the combining direction of the unit nanoparticles have the maximum extinction in the lowest wavelength range.

FIGS. 14A to 14C are graphs illustrating transmission of first to third nanoparticles according to Example 2 with respect to wavelength. Referring to FIG. 14A, it may be secured that the first nanoparticle A having the biggest length in the combining direction of the unit nanoparticles have the highest transmission in the highest wavelength range. Referring to FIG. 14B, the second nanoparticle B have the highest transmission in a middle wavelength range. Referring to FIG. 14C, the third nanoparticle C having the smallest length in the combining direction of the unit nanoparticles have the highest transmission in the lowest wavelength range.

FIGS. 15A to 15C are graphs illustrating fluorescence intensity of a color filter including first to third nanoparticles according to Example 2 with respect to wavelength. Referring to FIG. 15A, it may be secured that the first nanoparticle having the biggest length in the combining direction of the unit nanoparticles may maximize the fluorescence intensity of Oxatricarbocyanine. Referring to FIG. 15B, it may be secured that the second nanoparticle may maximize the fluorescence intensity of Nile Blue. Referring to FIG. 15C, it may be secured that the third nanoparticle may maximize the fluorescence intensity of Coumarin 343.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A display device, comprising:
   a first substrate; and
   a second substrate opposing the first substrate and comprising a color filter layer, the color filter layer comprising:
   a red color filter comprising a first fluorescent dye being provided with first light and emitting second light having a different wavelength from the first light, and a first nanoparticle being provided with the first light and generating surface Plasmon resonance, the red color filter illustrating red color,
   a green color filter comprising a second fluorescent dye being provided with the first light and emitting third light having a different wavelength from the first light and the second light, and a second nanoparticle being provided with the first light and generating surface Plasmon resonance, the green color filter illustrating green color; and
   a blue color filter comprising a third fluorescent dye being provided with the first light and emitting fourth light having a different wavelength from the first light to the third light, and a third nanoparticle being provided with the first light and generating surface Plasmon resonance, the blue color filter illustrating blue color,
   each of the first to third nanoparticles having a non-spherical shape,
   the first nanoparticle having a physical configuration that provides maximum extinction comprised of both absorption and scattering at a first wavelength,
   the second nanoparticle having a physical configuration that provides maximum extinction comprised of both absorption and scattering at a second wavelength smaller than the first wavelength,
   the third nanoparticle having a physical configuration that provides maximum extinction comprised of both absorption and scattering at a third wavelength smaller than the second wavelength, and
   wherein the cross-sectional shapes of the first to third nanoparticles are hexagonal, and
   the cross-sectional shape of the first nanoparticle has a first hexagon,
   the cross-sectional shape of the second nanoparticle has a second hexagon,
   the cross-sectional shape of the third nanoparticle has a third hexagon,
   the third hexagon is closer to a regular hexagon than the second hexagon, and
   the second hexagon is closer to a regular hexagon than the first hexagon.

2. The display device of claim 1, wherein
   the first hexagon comprises a first side and a second side connected to each other,
   the second hexagon comprises a first side and a second side connected to each other,
   the third hexagon comprises a first side and a side connected to each other, and
   $|A-1|>|B-1|>|C-1|$ is satisfied when ratio of a length of the first side of the first hexagon to a length of the second side of the first hexagon is A, ratio of a length of the first side of the second hexagon to a length of the second side of the second hexagon is B, and ratio of a length of the first side of the third hexagon to a length of the second side of the third hexagon is C.

3. The display device of claim 1, wherein each of the first to third nanoparticles has a hexagonal prism shape.

4. The display device of claim 3, wherein the heights of the first to third nanoparticles are substantially the same.

5. The display device of claim 1, wherein
   the first nanoparticle comprises non-spherical unit nanoparticle blocks,
   the second nanoparticle comprises the unit nanoparticle blocks, and
   the third nanoparticle comprises one or more of the unit nanoparticle blocks,
   where the number of the unit particle blocks in the first nanoparticle is "a," the number of the unit particle blocks in the second nanoparticle is "b," and the number of the unit particle block or the unit particle blocks in the third nanoparticle is "c," a, b and c being natural numbers satisfying a>b>c.

6. The display device of claim 5, wherein the first, second and third nanoparticles have rod shapes having different lengths, wherein the first nanoparticle is shorter than the second nanoparticle which is shorter than the third nanoparticle.

7. The display device of claim 5, wherein the cross-sectional shapes of the first, second and third nanoparticles are substantially same.

8. The display device of claim 7, wherein the cross-sectional shapes of the first, second and third nanoparticles have a circular shape or an elliptical shape.

9. The display device of claim 1, wherein each of the first to third nanoparticles has a cavity or a hole.

10. The display device of claim 1, wherein the first to third nanoparticles are formed of the same material.

11. The display device of claim 10, wherein each of the first to third nanoparticles is formed of at least one metal selected from the group consisting of Au, Ag, Al, Co, Cu, Cr, Pt, Ni, Fe, Mo and W, or an oxide of a selected metal.

12. The display device of claim 1, wherein
the first wavelength is from about 600 nm to about 750 nm,
the second wavelength is from about 500 nm to about 550 nm, and
the third wavelength is from about 430 nm to about 480 nm.

13. The display device of claim 1, wherein each of the red, green and blue color filters further comprises a leveling agent, and
wherein each of the first to third nanoparticle combines with the leveling agent and
each of a first nanoparticle combined with the leveling agent, a second nanoparticle combined with the leveling agent and a third nanoparticle combined with a leveling agent has a spherical shape.

14. The display device of claim 13, wherein the leveling agent includes at least one selected from the group consisting of hexane, heptane, octane, nonane, decane, undecane, dodecane, tridecane, tetradecane, pentadecane, hexadecane, cetane, heptadecane, octadecane, nonadecane and icosane.

15. The display device of claim 1, wherein the first substrate comprises a light emission layer, and the first fluorescent dye is configured to absorb light from the light emission layer and emit red color light, wherein the second fluorescent dye is configured to absorb light from the light emission layer and emit green color light, wherein the third fluorescent dye is configured to absorb light from the light emission layer and emit blue color light.

16. A display device, comprising:
a first substrate; and
a second substrate facing the first substrate and comprising a color filter layer, the color filter layer comprising:
a red color filter comprising a first fluorescent dye being provided with first light and emitting second light having a different wavelength from the first light, and a first nanoparticle, the red color filter illustrating red color;
a green color filter comprising a second fluorescent dye being provided with the first light and emitting third light having a different wavelength from the first light and the second light, and a second nanoparticle, the green color filter illustrating green color; and
a blue color filter comprising a third fluorescent dye being provided with the first light and emitting fourth light having a different wavelength from the first light to the third light, and a third nanoparticle, the blue color filter illustrating blue color,
each of the first to third nanoparticles having a non-spherical shape,
the first nanoparticle having a physical configuration that provides maximum extinction comprised of both absorption and scattering at a first wavelength,
the second nanoparticle having a physical configuration that provides maximum extinction comprised of both absorption and scattering at a second wavelength smaller than the first wavelength,
the third nanoparticle having a physical configuration that provides maximum extinction comprised of both absorption and scattering at a third wavelength smaller than the second wavelength, and
wherein the cross-sectional shapes of the first to third nanoparticles are hexagonal, and
the cross-sectional shape of the first nanoparticle has a first hexagon,
the cross-sectional shape of the second nanoparticle has a second hexagon,
the cross-sectional shape of the third nanoparticle has a third hexagon,
the third hexagon is closer to a regular hexagon than the second hexagon, and
the second hexagon is closer to a regular hexagon than the first hexagon.

* * * * *